US012663436B2

(12) United States Patent
Kim et al.

(10) Patent No.: US 12,663,436 B2
(45) Date of Patent: Jun. 23, 2026

(54) TEST SOCKET AND METHOD FOR FABRICATING THE SAME

(71) Applicant: LEENO INDUSTRIAL INC., Busan (KR)

(72) Inventors: Geunsu Kim, Busan (KR); Jaehwan Jeong, Busan (KR); Jungchul Shin, Busan (KR); Seungha Baek, Busan (KR)

(73) Assignee: LEENO INDUSTRIAL INC., Busan (KR)

(*) Notice: Subject to any disclaimer, the term of this patent is extended or adjusted under 35 U.S.C. 154(b) by 287 days.

(21) Appl. No.: 17/777,221

(22) PCT Filed: May 18, 2021

(86) PCT No.: PCT/KR2021/006239
§ 371 (c)(1),
(2) Date: May 16, 2022

(87) PCT Pub. No.: WO2021/235844
PCT Pub. Date: Nov. 25, 2021

(65) Prior Publication Data
US 2022/0413008 A1 Dec. 29, 2022

(30) Foreign Application Priority Data

May 22, 2020 (KR) ........................ 10-2020-0061463
Jan. 29, 2021 (KR) ........................ 10-2021-0013607

(51) Int. Cl.
*G01R 1/04* (2006.01)
*G01R 1/067* (2006.01)
*G01R 1/073* (2006.01)

(52) U.S. Cl.
CPC ......... *G01R 1/045* (2013.01); *G01R 1/06755* (2013.01); *G01R 1/07314* (2013.01)

(58) Field of Classification Search
CPC ................ G01R 1/045; G01R 1/06755; G01R 1/07314; G01R 3/00; B29C 45/14
See application file for complete search history.

(56) References Cited

U.S. PATENT DOCUMENTS

| | | | | |
|---|---|---|---|---|
| 12,105,133 | B2 * | 10/2024 | Baek ...................... | G01R 1/045 |
| 2002/0180422 | A1 * | 12/2002 | McAllister ........... | G01R 1/0416 |
| | | | | 324/754.18 |

(Continued)

FOREIGN PATENT DOCUMENTS

| | | |
|---|---|---|
| JP | 2003-302441 A | 10/2003 |
| JP | 2006-125938 A | 5/2006 |

(Continued)

OTHER PUBLICATIONS

English translation of KR-20170119514-A. (Year: 2017).*

(Continued)

*Primary Examiner* — Huy Q Phan
*Assistant Examiner* — Haidong Zhang
(74) *Attorney, Agent, or Firm* — Sughrue Mion, PLLC

(57) ABSTRACT

The disclosure relates to a method of fabricating a test socket that supports a probe stretchable in a longitudinal direction. The method of fabricating a test socket includes forming a probe hole for accommodating the probe in a base member made of a conductive material, filling the probe hole with a resin as an insulating material to a predetermined depth from an upper surface of the base member to form a probe support member; and forming a first support hole for supporting one end portion of the probe in the probe support member in the probe hole to expose the one end portion of the probe.

14 Claims, 36 Drawing Sheets

(56)    References Cited

U.S. PATENT DOCUMENTS

| | | | | |
|---|---|---|---|---|
| 2004/0212381 A1 | 10/2004 | Yoshida et al. | | |
| 2005/0225313 A1* | 10/2005 | Kazama | ............... | G01R 1/0483 |
| | | | | 324/756.03 |
| 2006/0010498 A1 | 1/2006 | Oh et al. | | |
| 2006/0094134 A1* | 5/2006 | Yoshida | ................. | G01R 1/045 |
| | | | | 257/48 |
| 2006/0152240 A1* | 7/2006 | Lee | ................... | G01R 1/07314 |
| | | | | 324/755.05 |
| 2010/0041251 A1* | 2/2010 | Nakayama | ......... | H01R 13/2421 |
| | | | | 439/65 |
| 2011/0221464 A1* | 9/2011 | Nagata | .............. | G01R 1/06722 |
| | | | | 324/755.05 |
| 2011/0227596 A1* | 9/2011 | Kazama | .............. | G01R 1/0466 |
| | | | | 324/756.03 |
| 2013/0271175 A1 | 10/2013 | Powell | | |
| 2015/0233973 A1* | 8/2015 | Wooden | .............. | G01R 1/0441 |
| | | | | 29/876 |
| 2015/0233978 A1 | 8/2015 | Wooden et al. | | |
| 2016/0154024 A1* | 6/2016 | Miyagawa | .......... | G01R 1/0466 |
| | | | | 324/755.11 |
| 2017/0059611 A1* | 3/2017 | Lesnikoski | ........... | G01R 1/045 |
| 2019/0018045 A1* | 1/2019 | Jeong | .................... | G01R 1/045 |
| 2019/0206750 A1 | 7/2019 | Chen et al. | | |
| 2020/0241042 A1 | 7/2020 | Jeong et al. | | |
| 2020/0309820 A1 | 10/2020 | Chiang et al. | | |
| 2022/0413008 A1* | 12/2022 | Kim | ................... | G01R 1/06755 |

FOREIGN PATENT DOCUMENTS

| | | | |
|---|---|---|---|
| JP | 2006-125988 A | 5/2006 | |
| JP | 2007-178165 A | 7/2007 | |
| JP | 2010-237133 A | 10/2010 | |
| JP | 2016-102696 A | 6/2016 | |
| KR | 10-2004-0093023 A | 11/2004 | |
| KR | 10-2006-0052285 A | 5/2006 | |
| KR | 10-2006-0005285 A | 1/2008 | |
| KR | 10-1534778 B1 | 7/2015 | |
| KR | 10-2017-0080854 A | 8/2017 | |
| KR | 10-2017-0090854 A | 8/2017 | |
| KR | 20170119514 A * | 10/2017 | ........ G01R 31/2896 |
| KR | 10-2019-0051764 A | 5/2019 | |
| TW | 201118381 A | 6/2011 | |
| TW | I679424 8 | 12/2019 | |
| TW | I679424 B | 12/2019 | |

OTHER PUBLICATIONS

Machine translation of Office Action dated Feb. 16, 2022 from the Taiwan Patent Office in Application No. 110113673.

Machine translation of Office Action dated Sep. 5, 2022 from the Taiwan Patent Office in Application No. 110113673.

Communication dated Oct. 25, 2024 issued by the United States Patent and Trademark Office in U.S. Appl. No. 18/619,080.

International Search Report for PCT/KR2021/006239 dated Sep. 6, 2021.

Written Opinion for PCT/KR2021/006239 dated Sep. 6, 2021.

Notification of Reasons for Refusal dated Feb. 28, 2023 from the Japanese Patent Office in Application No. 2022-519731.

Notice of Allowance dated May 19. 2023 from the Korean Patent Office Application No. 10-2021-0013607.

\* cited by examiner

[Figure 1]
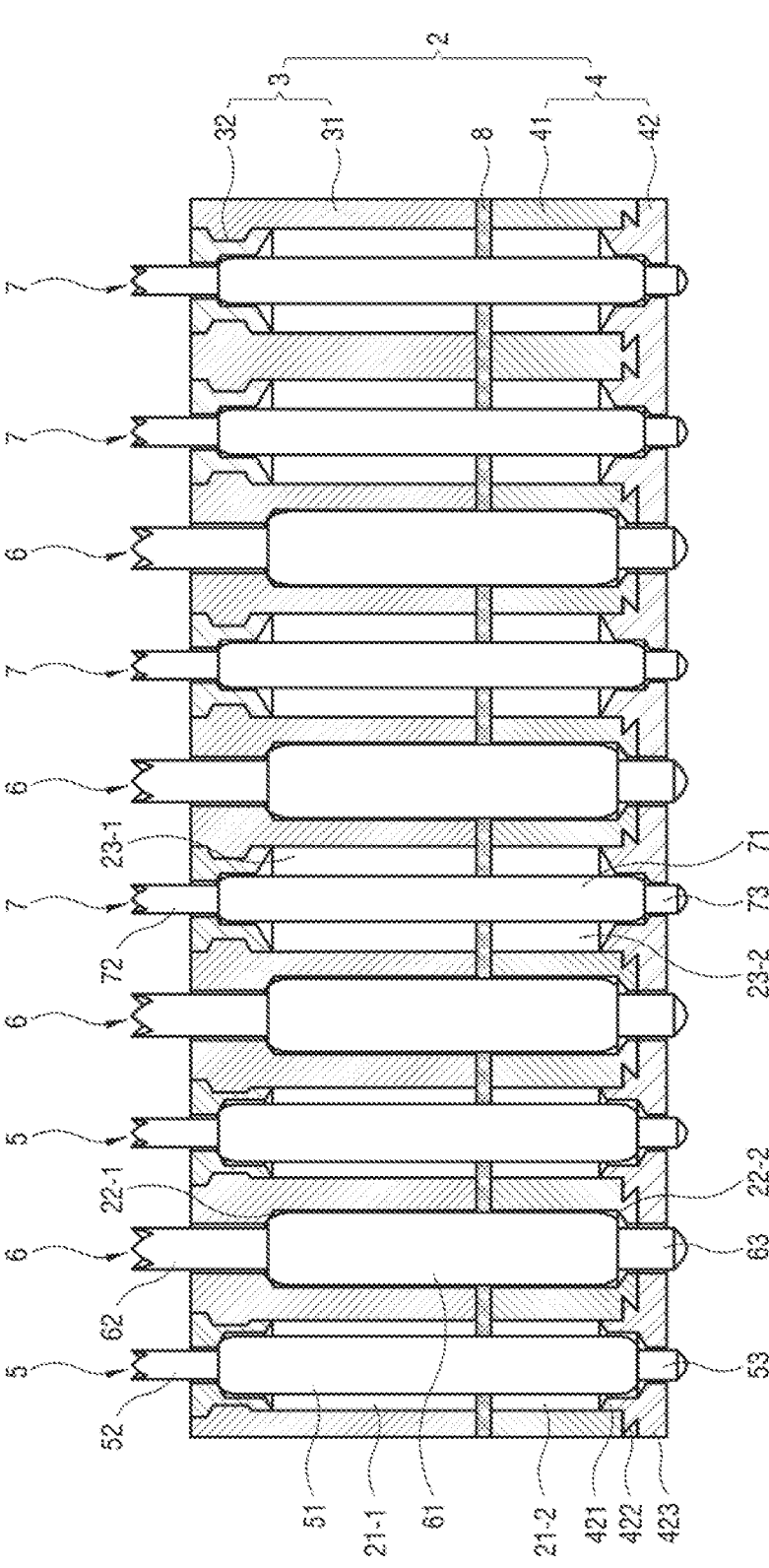

[Figure 2]
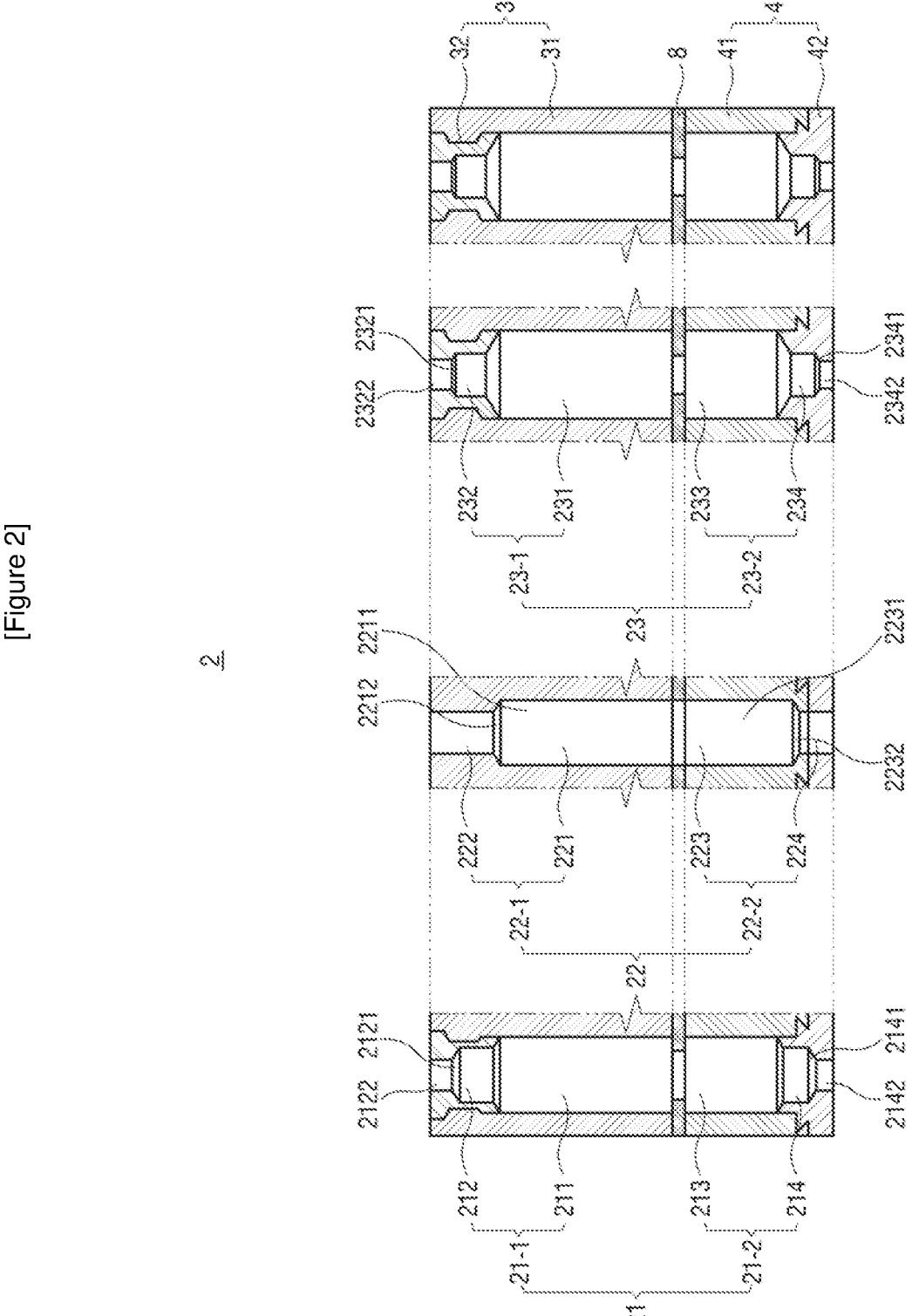

[Figure 3]
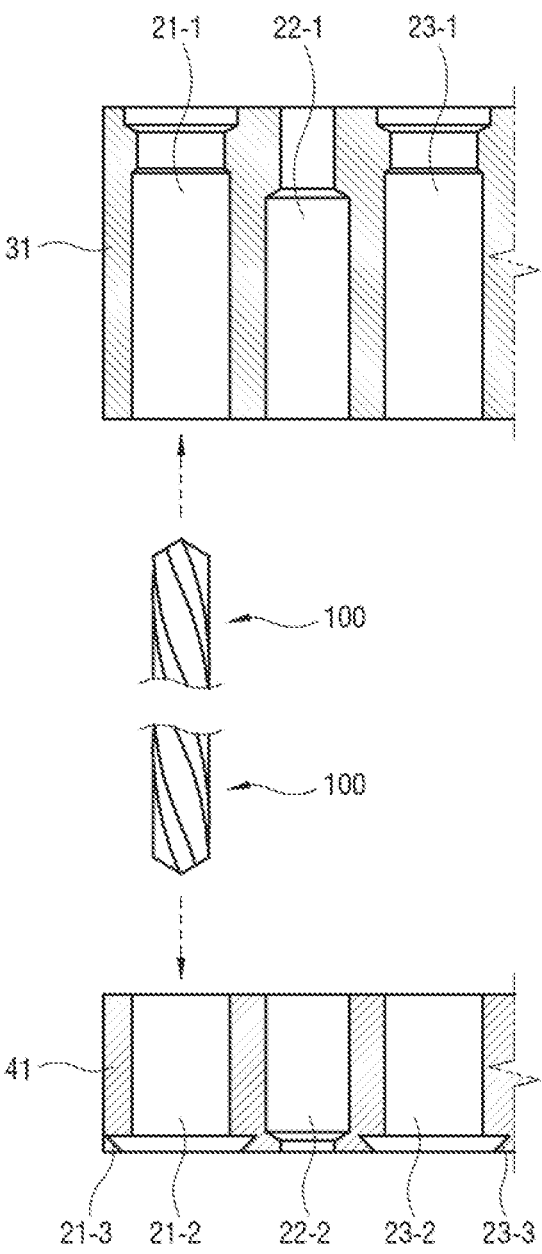

【Figure 4】
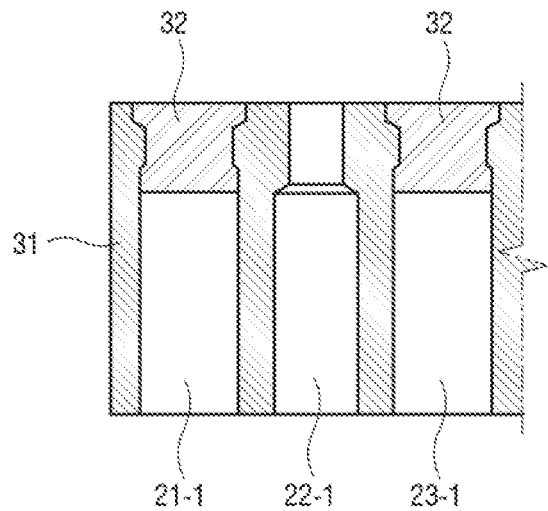
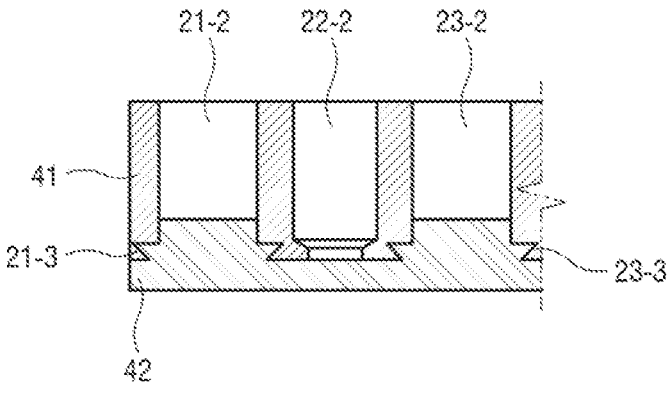

[Figure 5]
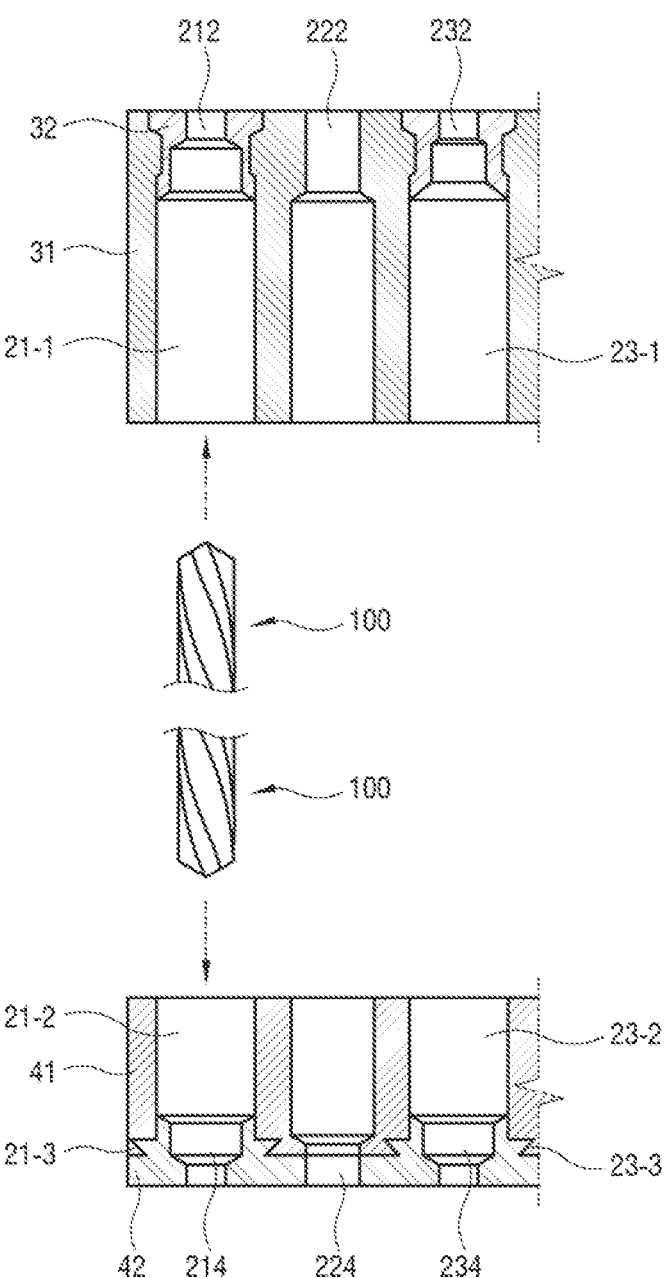

【Figure 6】
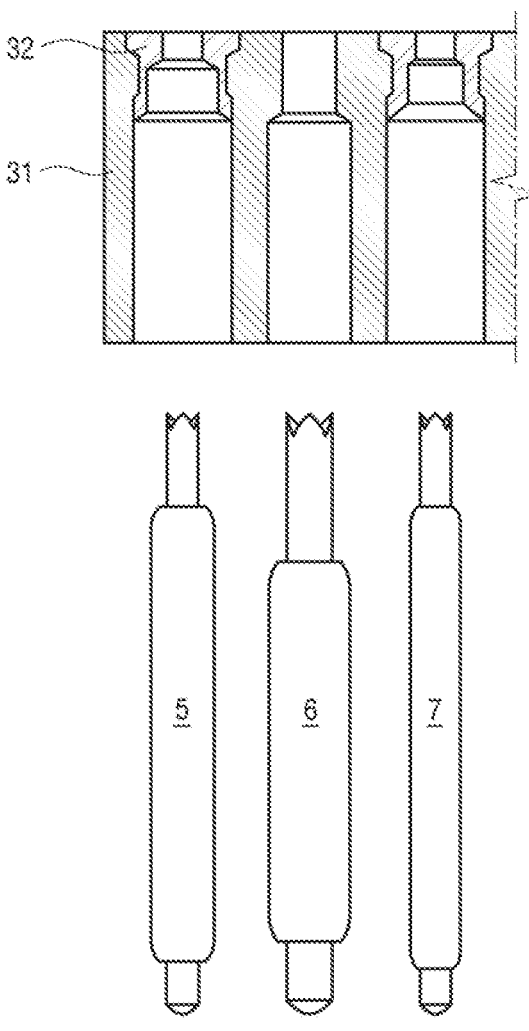
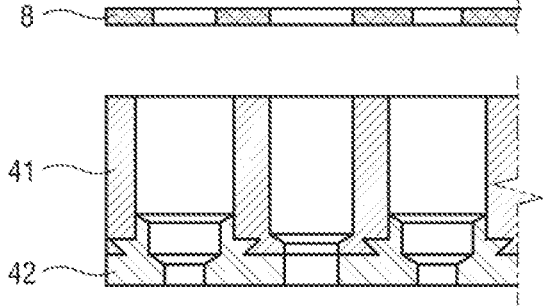

【Figure 7】
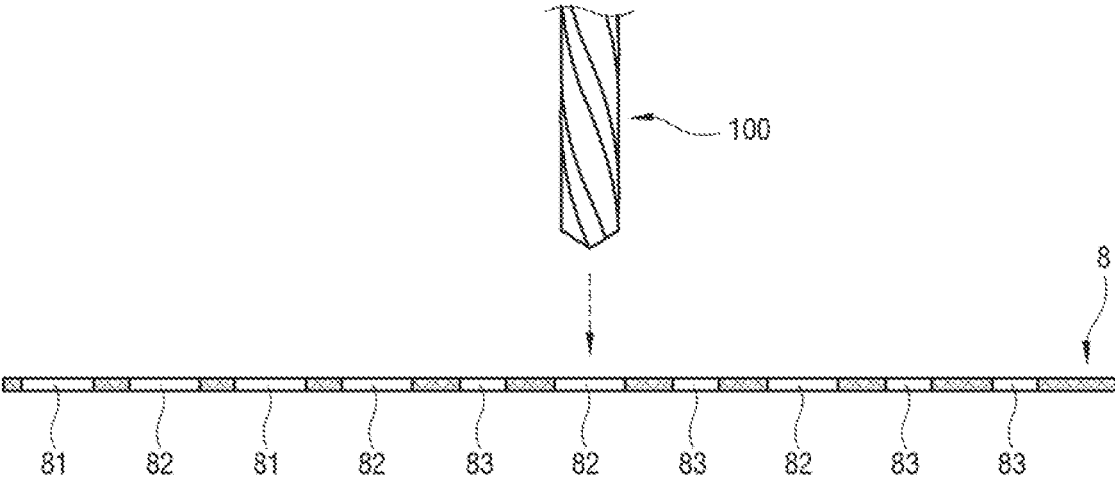
【Figure 8】
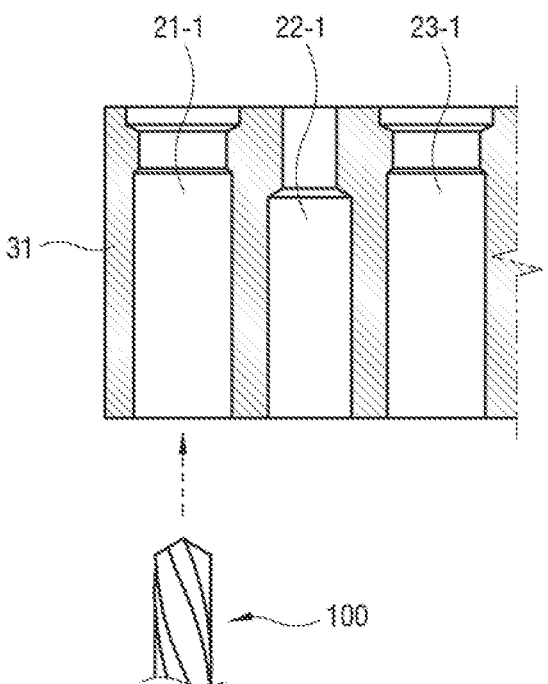

【Figure 9】
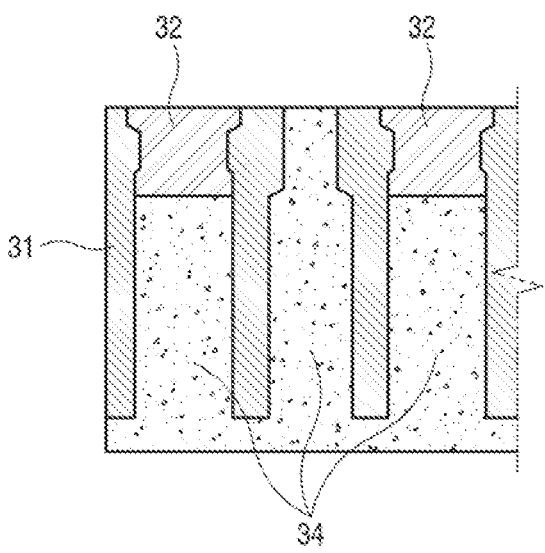

【Figure 10】
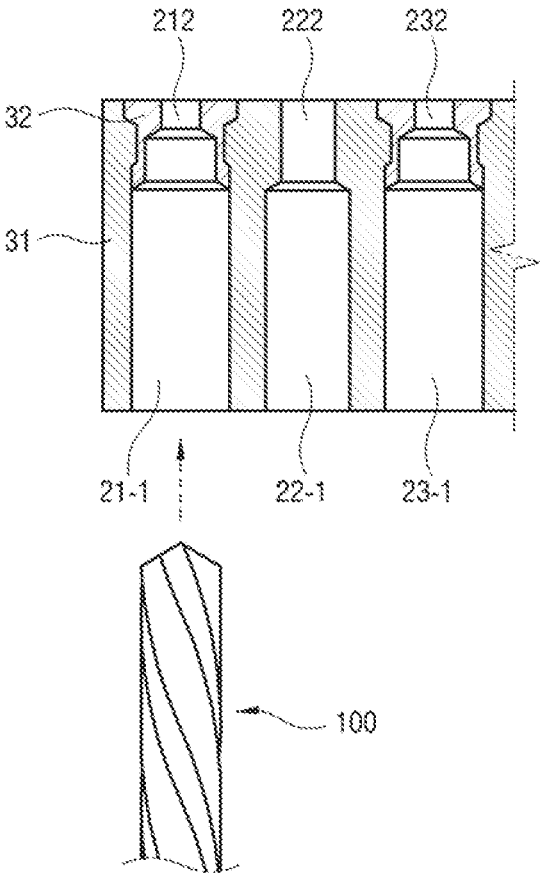
【Figure 11】
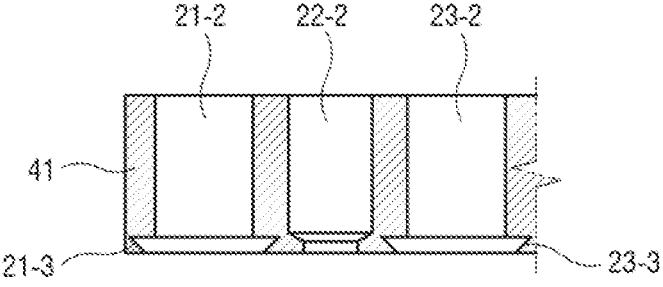

【Figure 12】
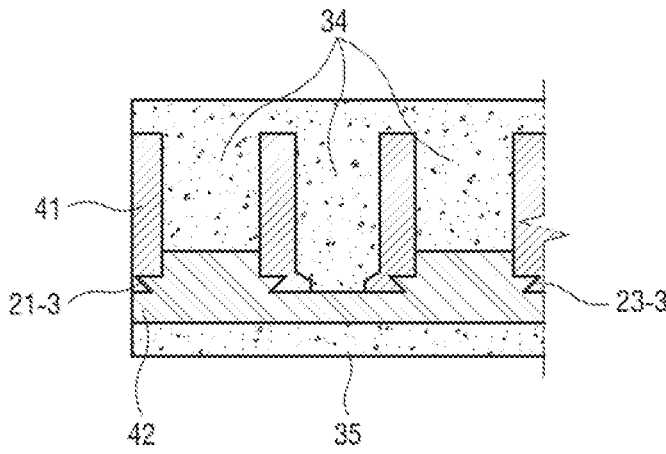
【Figure 13】
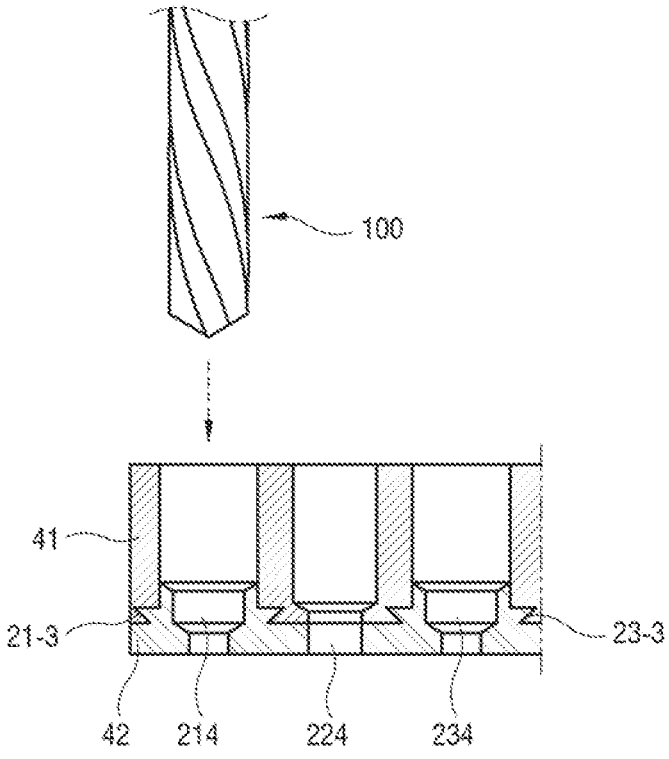

【Figure 14】
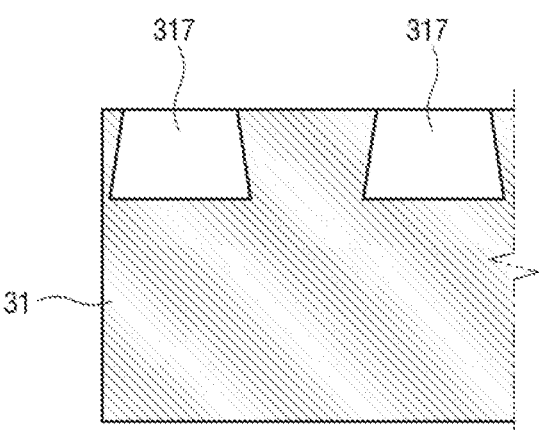
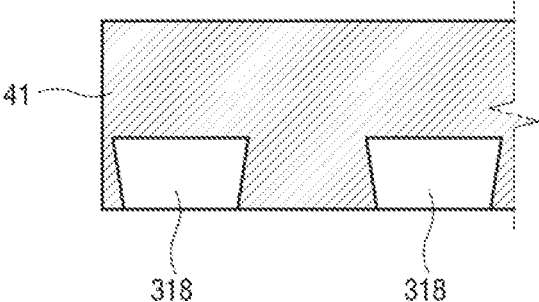

[Figure 15]
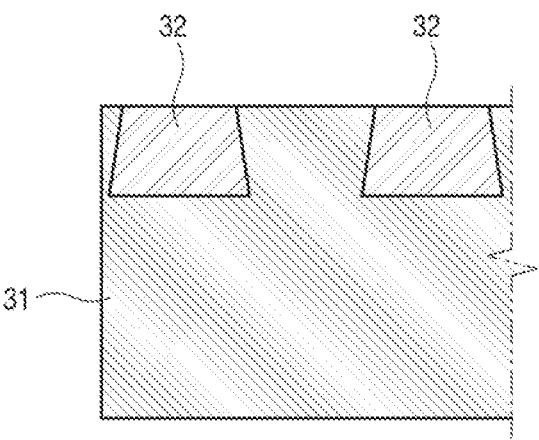
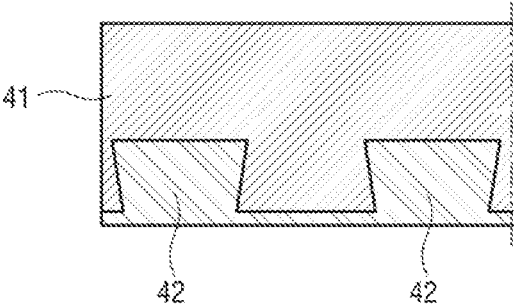

【Figure 16】
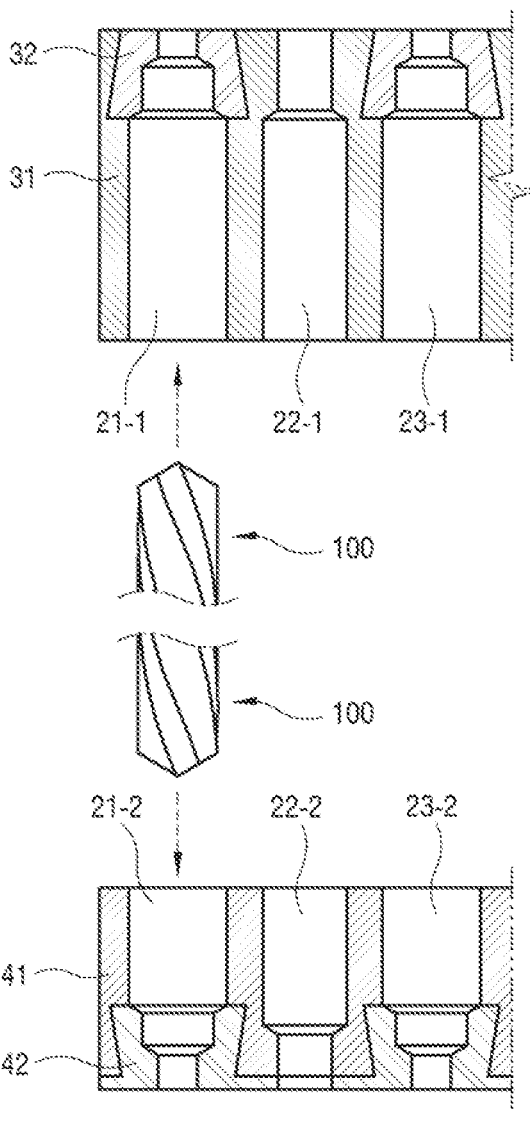

【Figure 17】
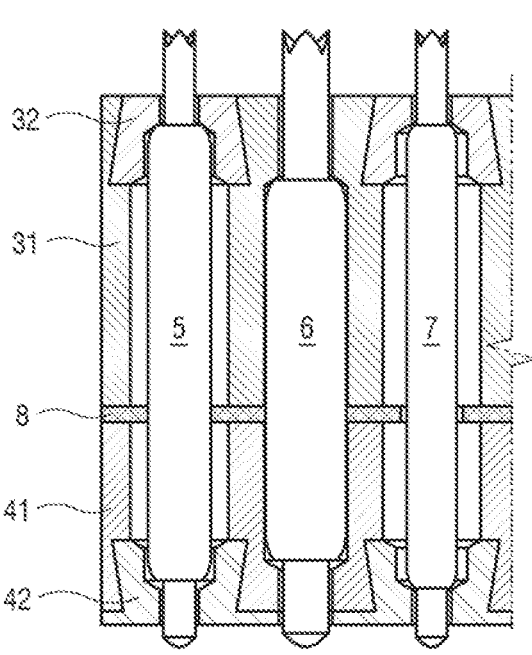

【Figure 18】
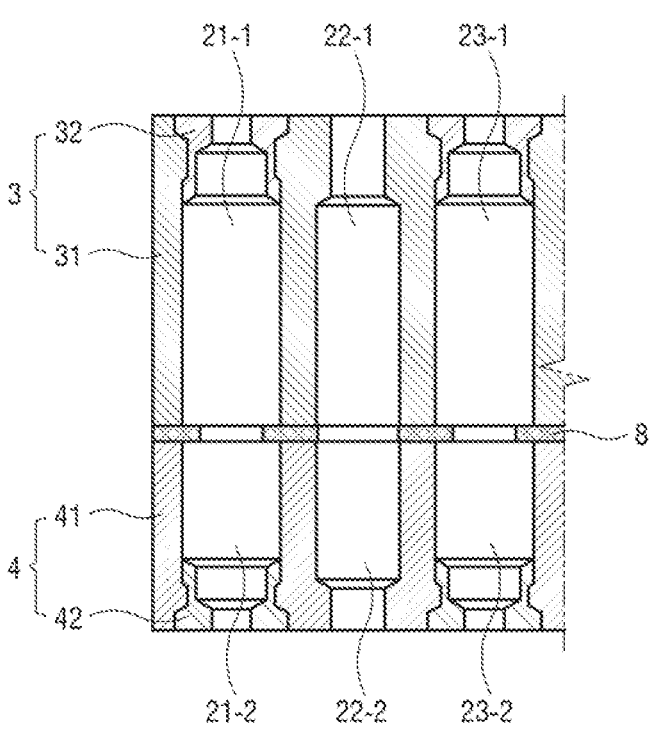

[Figure 19]
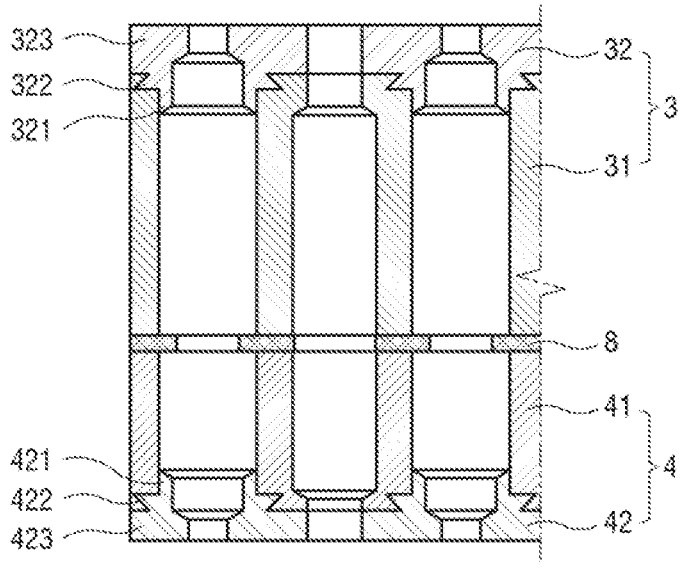

【Figure 20】
2
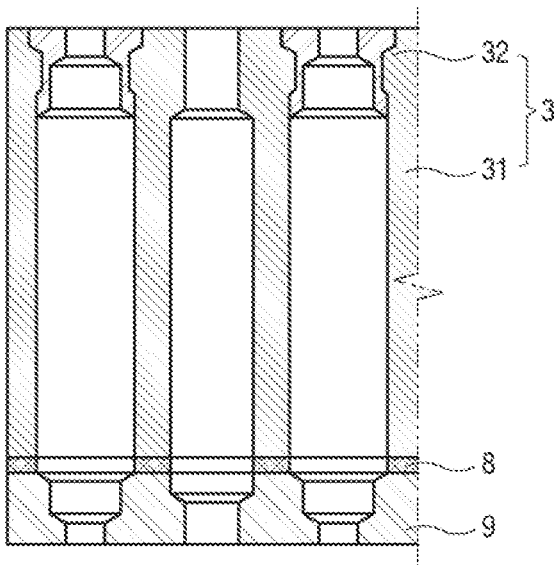

【Figure 21】
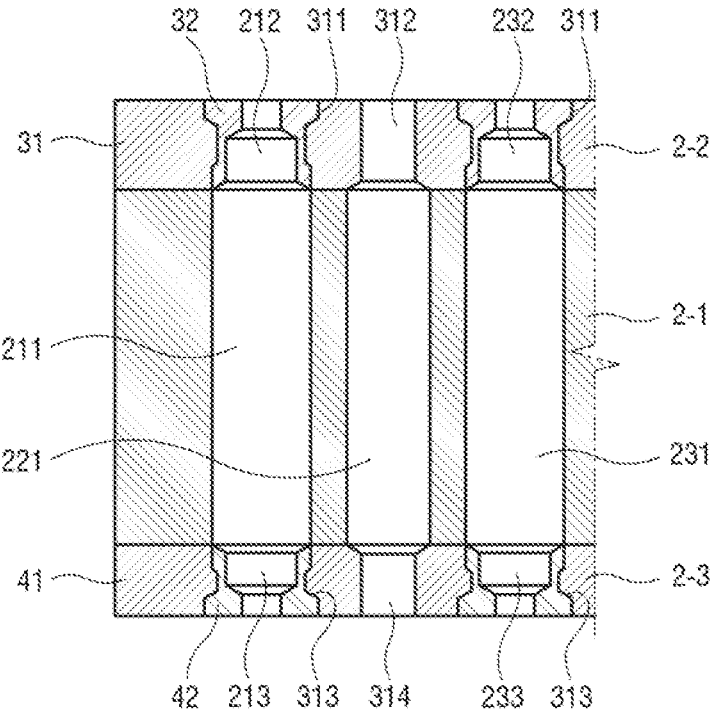
【Figure 22】
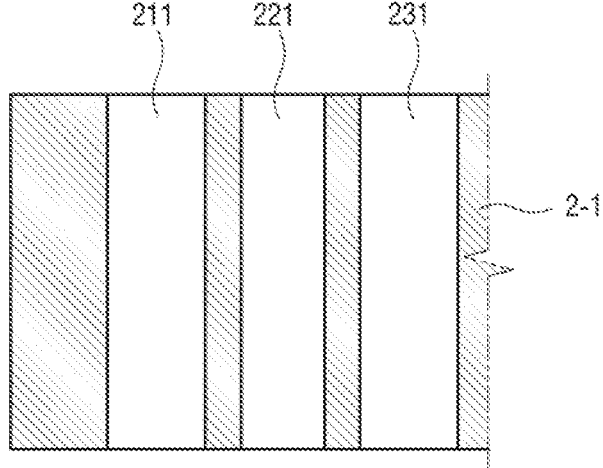

【Figure 23】
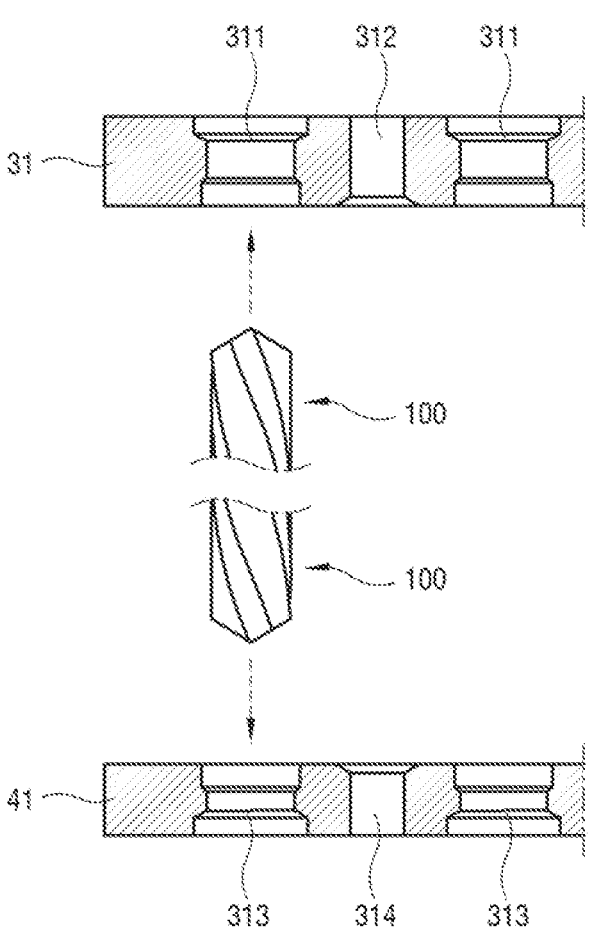

[Figure 24]
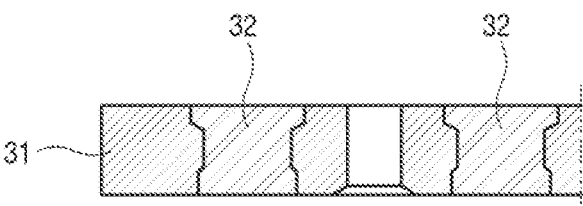
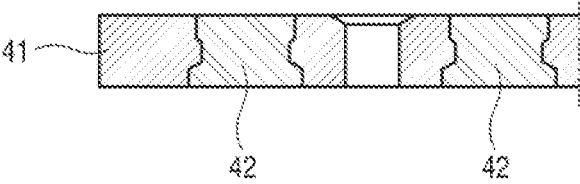

【Figure 25】
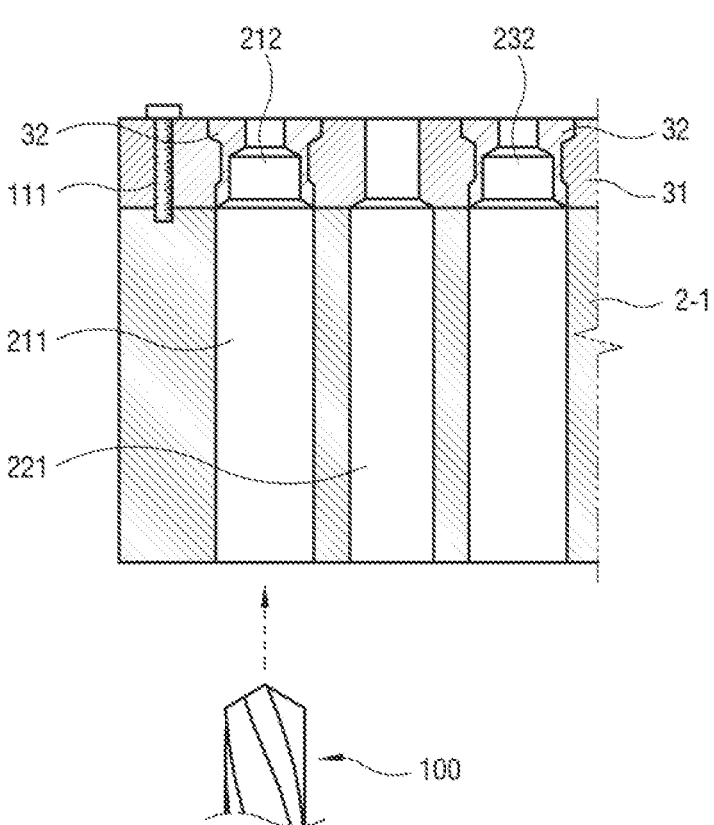

【Figure 26】
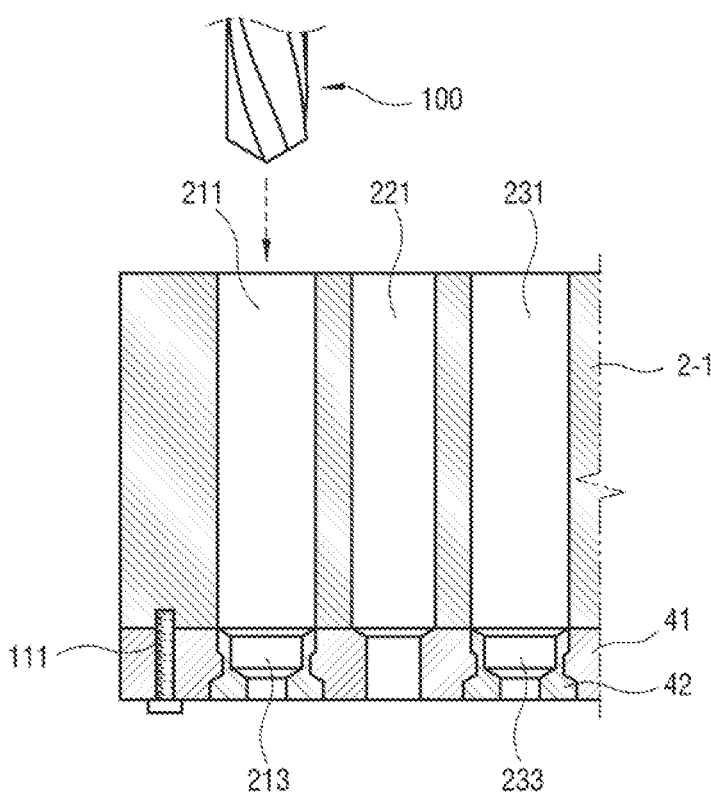

【Figure 27】
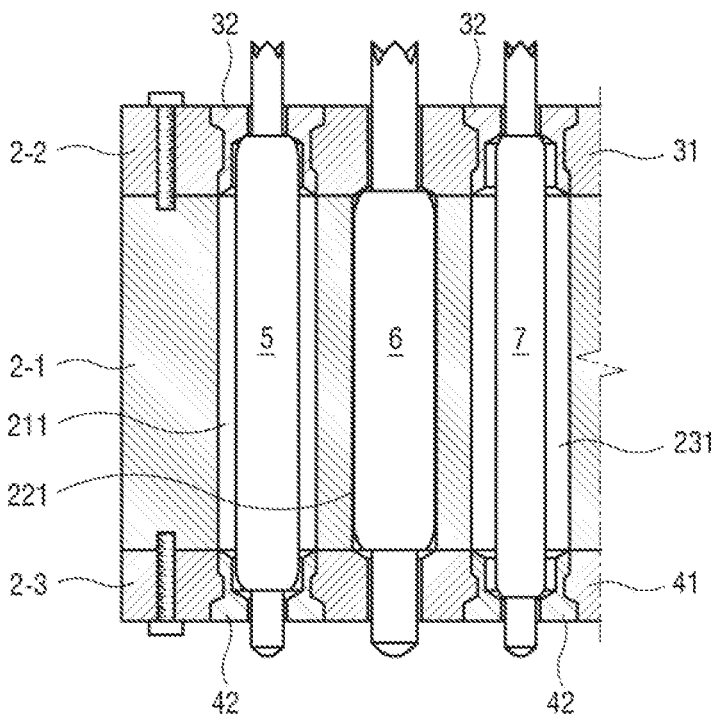
【Figure 28】
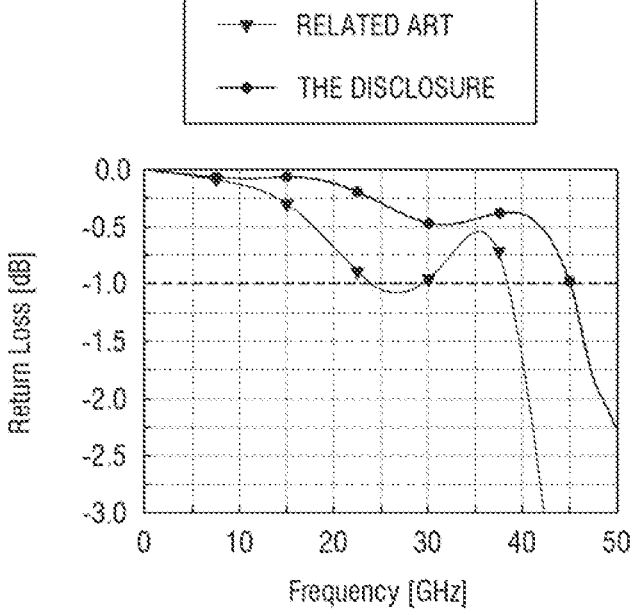

【Figure 29】
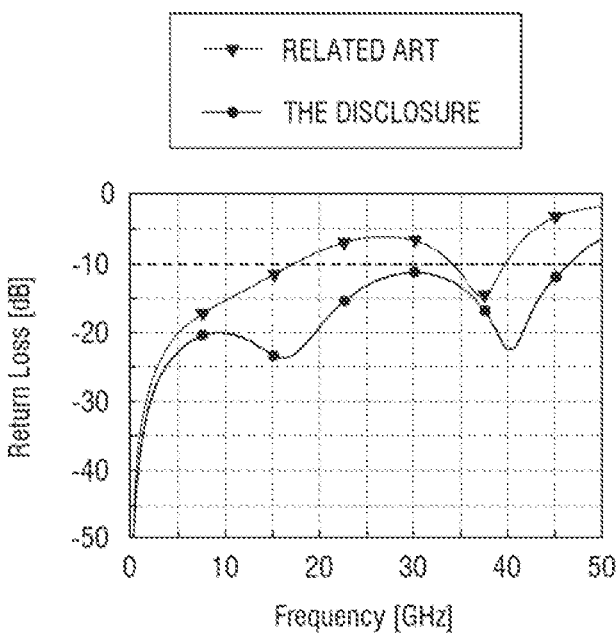
【Figure 30】
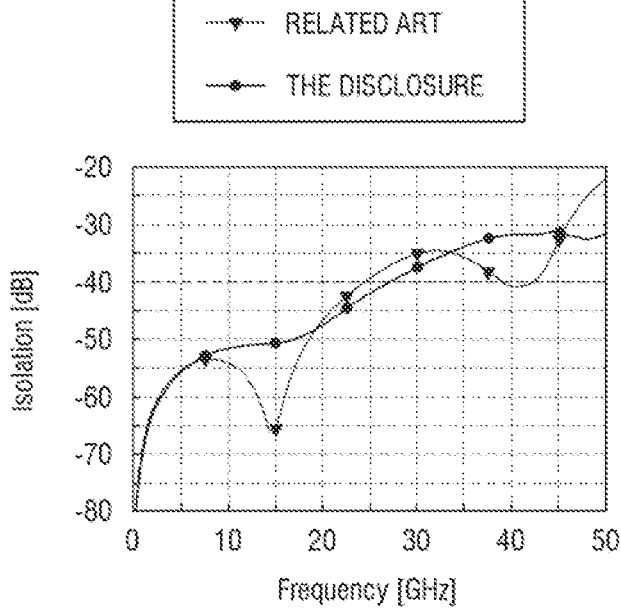

【Figure 31】
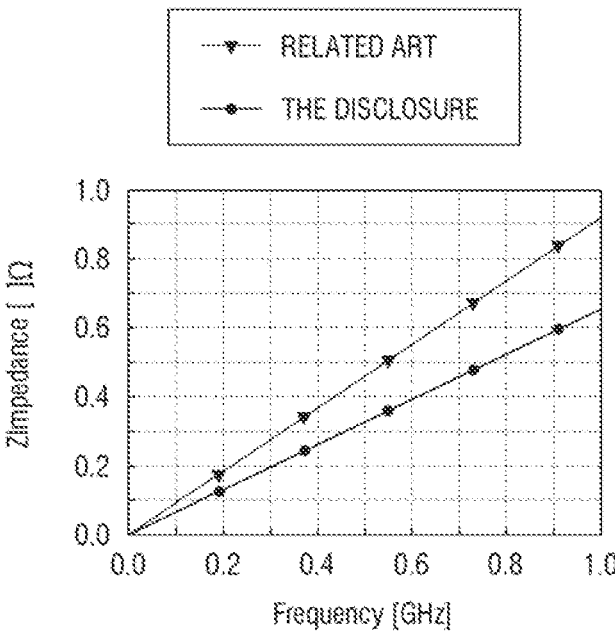

[Figure 32]
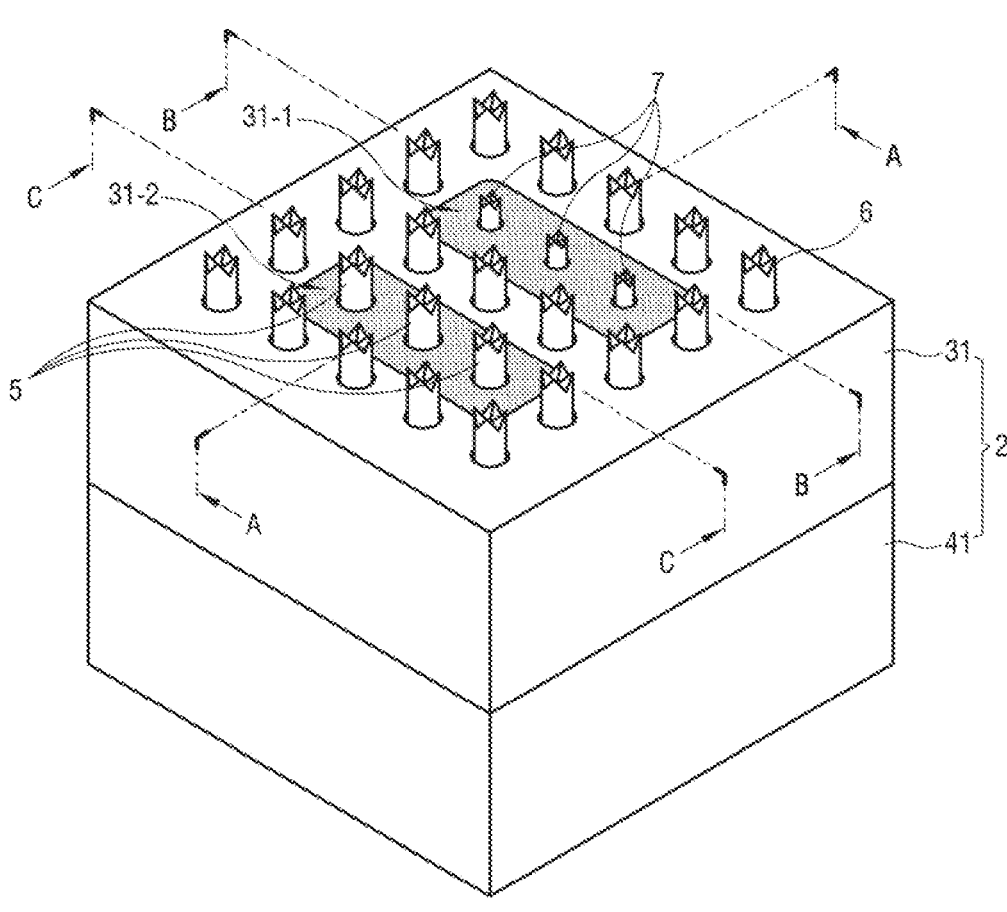

【Figure 35】
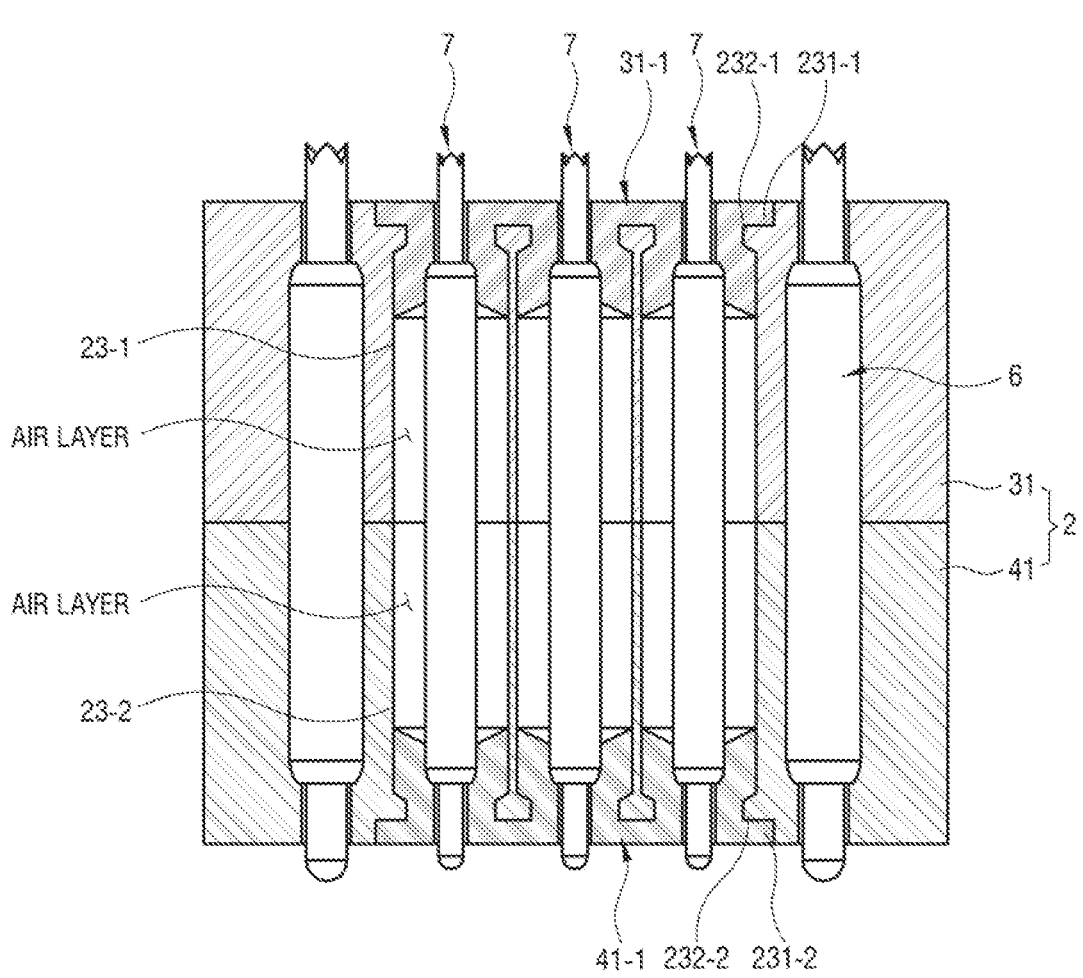

[Figure 36]
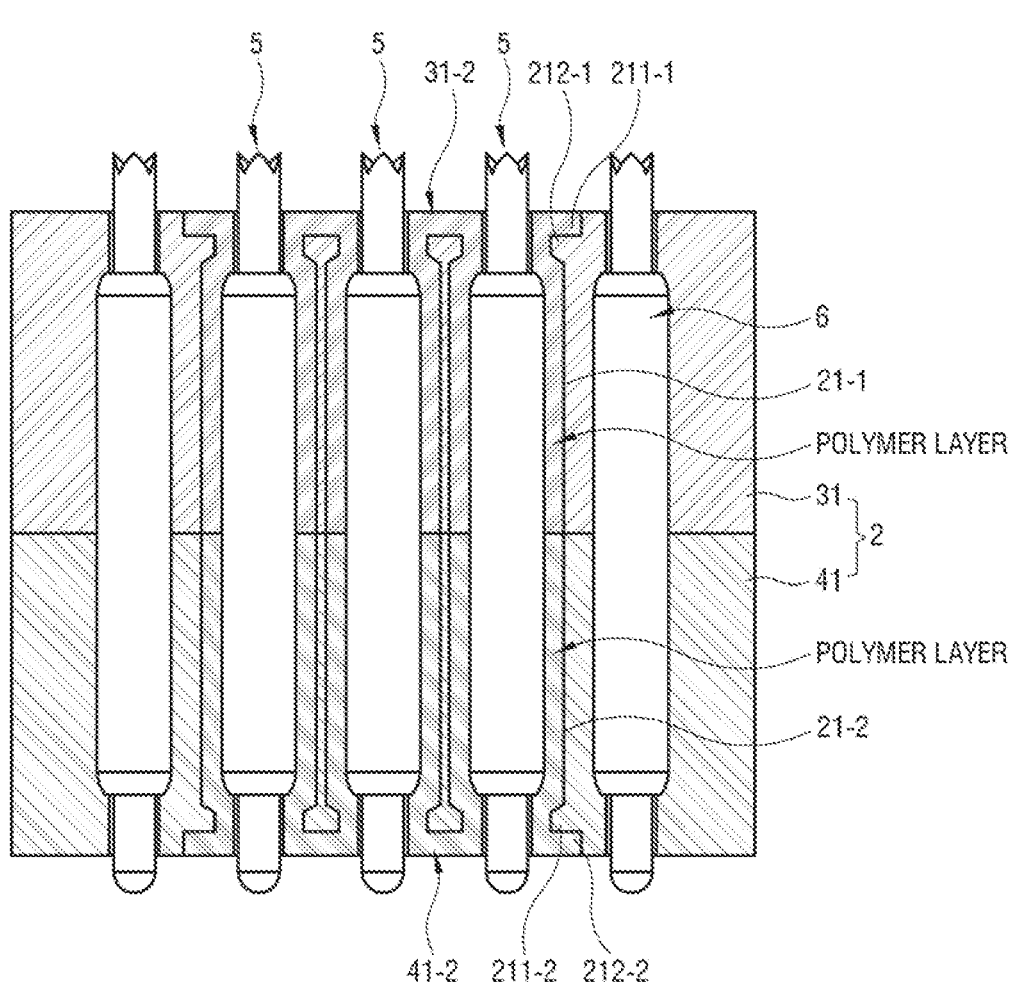

【Figure 37】
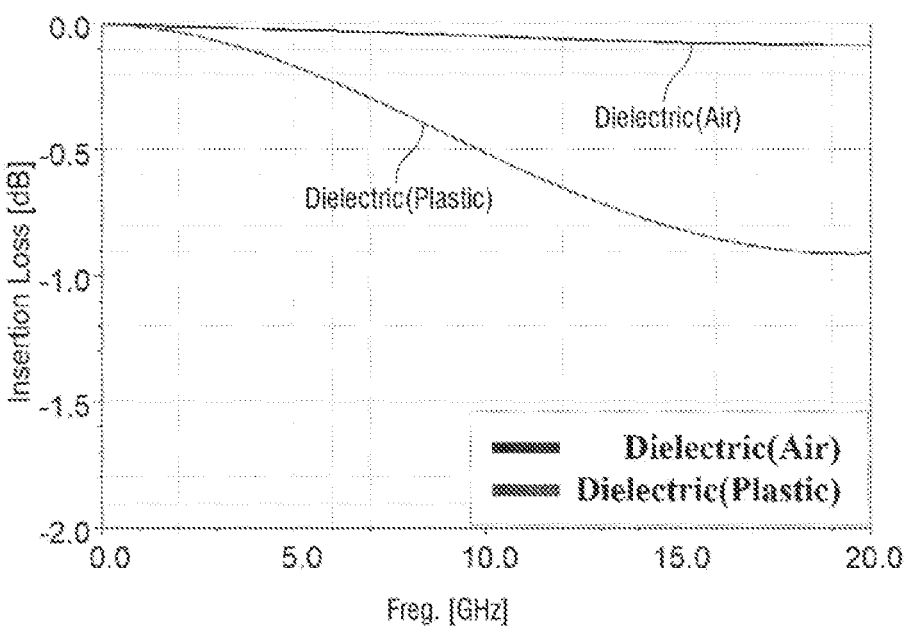
【Figure 38】
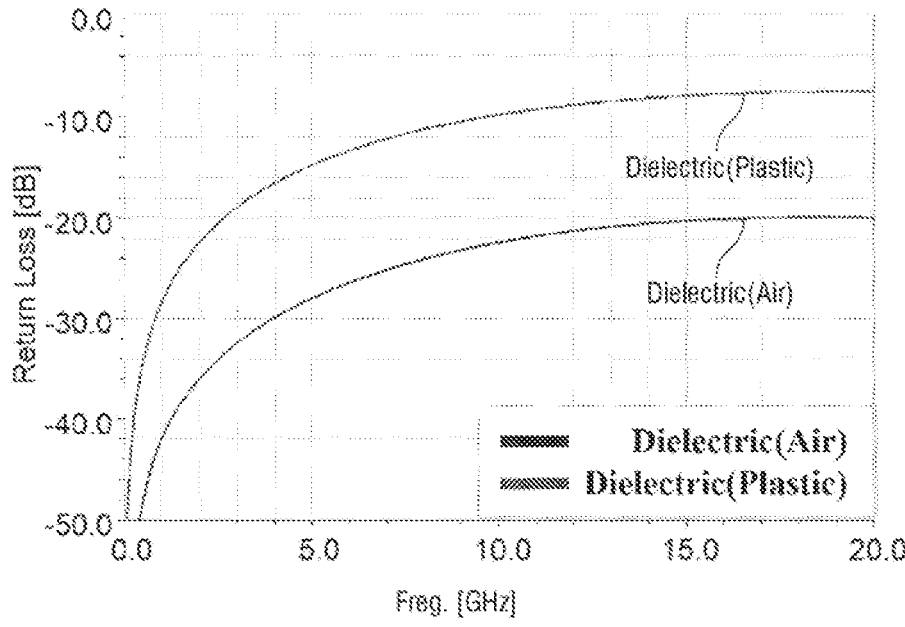

【Figure 39】
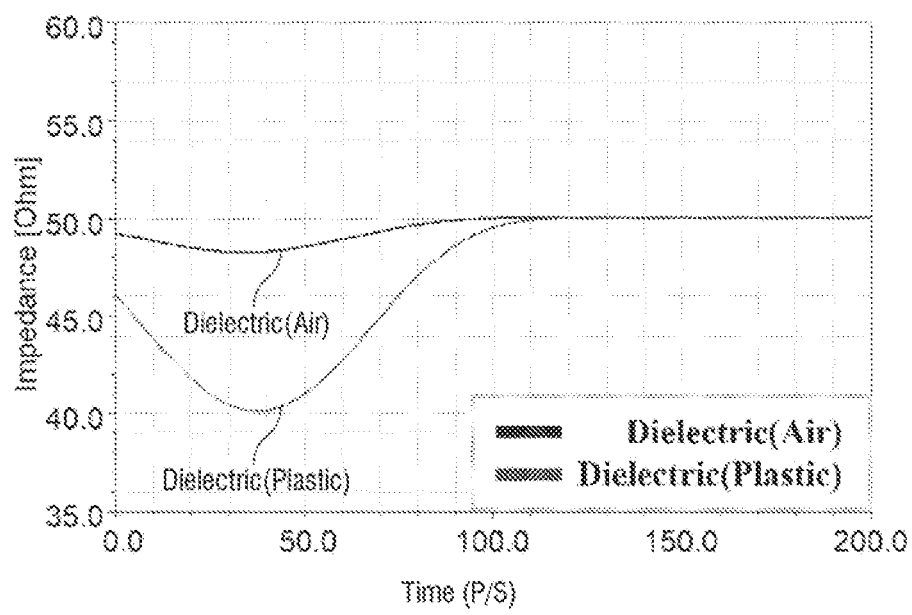
【Figure 40】
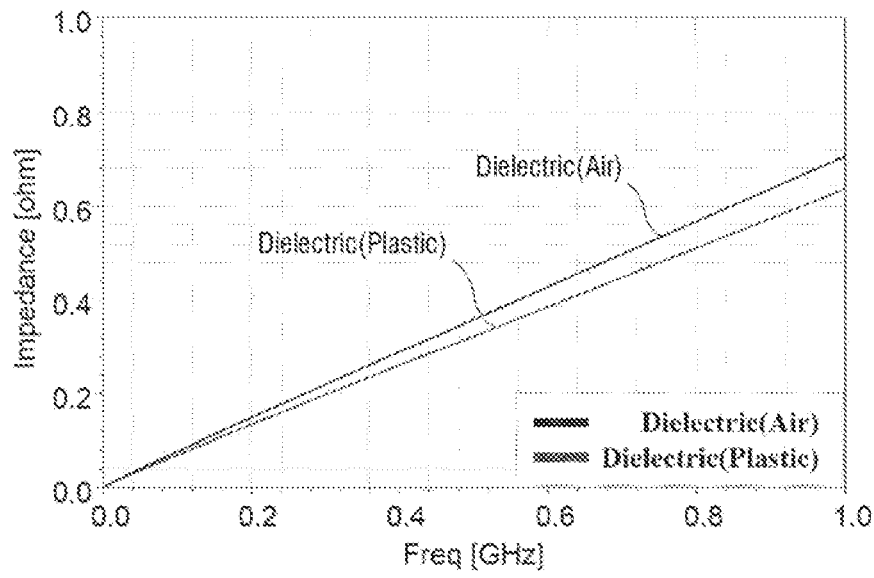

【Figure 41】
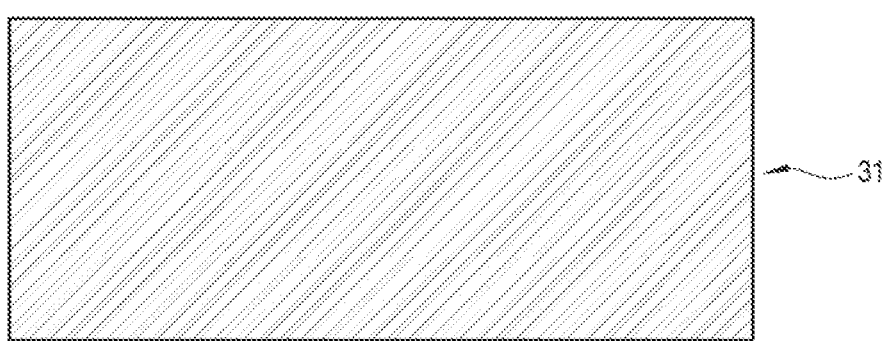
31
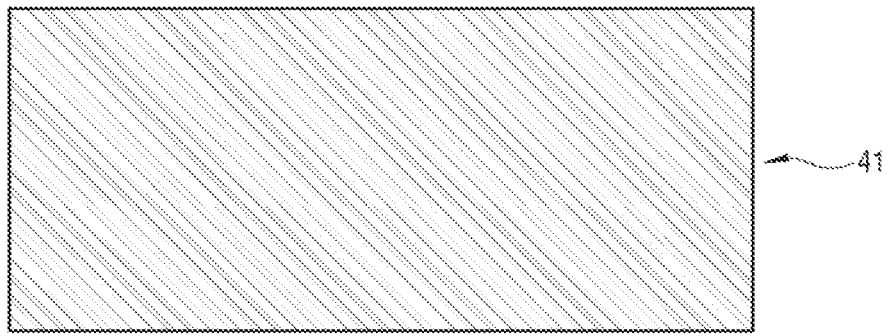
41

【Figure 42】
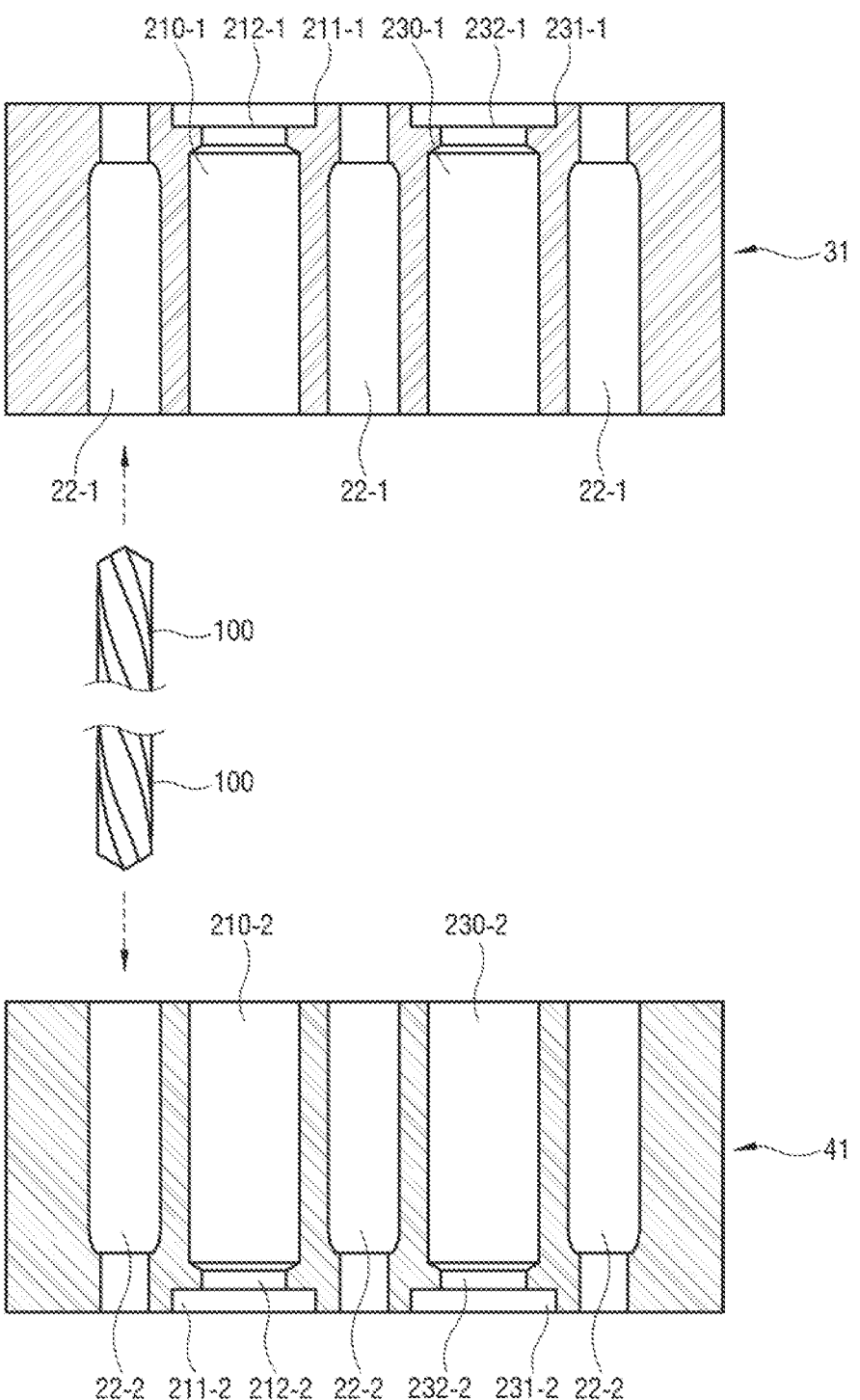

【Figure 43】
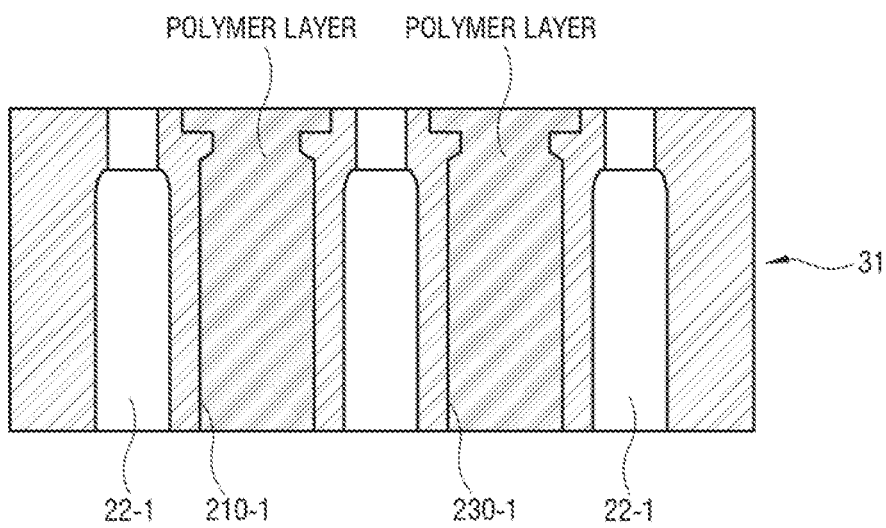
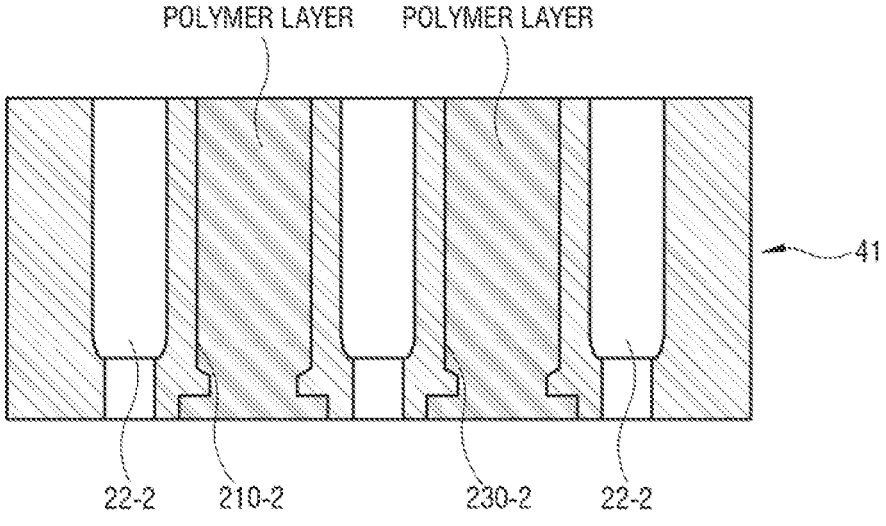

【Figure 44】
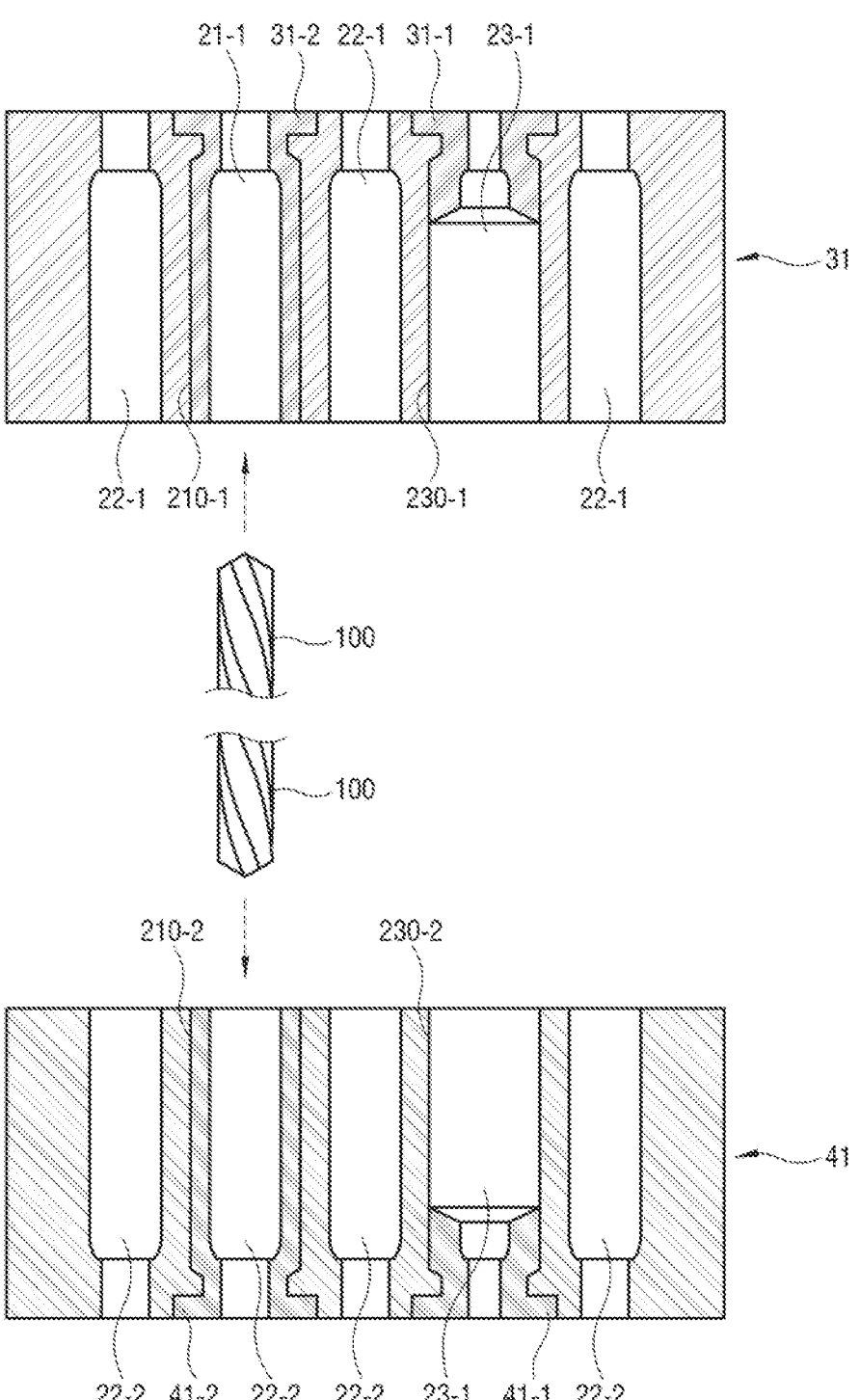

TEST SOCKET AND METHOD FOR FABRICATING THE SAME

CROSS REFERENCE TO RELATED APPLICATIONS

This application is a National Stage of International Application No. PCT/KR2021/006239 filed May 18, 2021, claiming priority based on Korean Patent Application No. 10-2020-0061463 filed May 22, 2020 and Korean Patent Application No. 10-2021-0013607 filed Jan. 29, 2021.

TECHNICAL FIELD

The disclosure relates to a test socket for checking electrical characteristics of a test object and a method of fabricating the same.

BACKGROUND ART

A test socket for high-frequency or high-speed semiconductor testing shields interference or noise between adjacent signal probes by supporting signal probes to a conductive block in a non-contact state. In a method of supporting the signal probe on the conductive block in the non-contact state, insulating support plates are disposed on both sides of the conductive block to support both end portions of the signal probe. At this time, after a probe accommodating hole for accommodating a barrel of the probe is formed in the conductive block and a probe supporting hole for supporting an end portion of the barrel is formed on the insulating support plate, the conductive block and the insulating support are joined by a bolt so that the probe accommodating hole and the probe supporting hole are aligned. In the conventional method of fabricating a test socket, since the process of fabricating the probe accommodating hole and the process of fabricating the probe supporting hole are individually performed, as the number of probes increases, the process error and alignment error also increase. Therefore, the signal probes accommodated in and supported by the plurality of probe accommodating holes and the probe support holes deviate from central axes of the probe accommodating holes, and as a result, insertion loss characteristics, return loss characteristics, crosstalk characteristics, isolation characteristics, Z-Impedance characteristics, and inductance characteristics may deteriorate.

DISCLOSURE

Technical Problem

The disclosure is to provide a test socket for high-frequency or high-speed semiconductor test with excellent characteristics and a method of fabricating the same.

Technical Solution

In one general aspect, there is provided a method of fabricating a test socket that supports a probe stretchable in a longitudinal direction, the method including: forming a probe hole for accommodating the probe in a base member made of a conductive material; filling the probe hole with an insulating material to a predetermined depth from an upper surface of the base member to form a probe support member; and forming a first support hole for supporting one end portion of the probe in the probe support member in the probe hole.

The filling of the insulating material may include: disposing a mold cover to be spaced apart from one surface of the base member at a predetermined interval; and filling the spaced interval and the probe hole with the insulating material.

The method may further include: forming a coupling groove surrounding the probe hole on one surface of the base member.

The coupling groove may have a cross-sectional area widening in a depth direction from the one surface.

The method may further include: forming a second support hole for supporting the probe in a cover member made of an insulating material; inserting the probe into the probe hole in a non-contact state and supporting both end portions of the probe in the first support hole and the second support hole, respectively; and joining the cover member to a lower surface of the base member.

The method may further include interposing a gap plate between the base member and the cover member.

The probe hole may include a protrusion protruding inwardly at a position where the probe support part is formed.

In another general aspect, there is provided a method of fabricating a test socket that supports a probe stretchable in a longitudinal direction, the method including: forming a first recessed part with a predetermined depth on one surface of a first base member made of a conductive material at a position where the probe is disposed; forming a first probe support part by filling the first recessed part with an insulating material; and forming a first probe accommodating hole for accommodating the probe in the first base member at a position corresponding to the first recessed part, and forming a first support hole for supporting one end portion of the probe in the first probe support part.

The method may further include: forming a second support hole for supporting the other end portion of the probe in a cover member made of an insulating material; inserting the probe into the first probe accommodating hole and supporting one end portion and the other end portion of the probe in the first support hole and the second support hole, respectively; and joining the cover member to the other surface of the first base member.

The method may further include: forming a first recessed portion with a predetermined depth on one surface of a second base member made of a conductive material at a position where the probe is disposed; forming a second probe support part by filling the second recessed part with an insulating material; forming a second probe accommodating hole for accommodating the probe in the first base member at a position corresponding to the first recessed part, and forming a second support hole for supporting the other end portion of the probe in the second probe support part; inserting the probe into the first probe accommodating hole and the second probe accommodating hole and supporting one end portion and the other end portion of the probe in the first support hole and the second support hole, respectively; and joining the other surface of the second base member to the other surface of the first base member.

In another general aspect, there is provided a method of fabricating a test socket that supports a probe stretchable in a longitudinal direction, the method including: forming a probe accommodating hole for accommodating the probe in a base block made of a conductive material; forming first and second through holes in positions corresponding to the probe accommodating hole in the first base member and the second base member of a conductive material, respectively; forming first and second probe support portions by filling an insulating material in the first and second through holes; forming first and second support holes for supporting both ends of the probe in the first and second probe support portions; and inserting the probe into the probe accommodating hole, supporting the both ends of the probe in the first and second support holes, and joining the first and second base members to upper and lower surfaces of the base block, respectively.

In another general aspect, there is provided a method of fabricating a test socket that supports a plurality of probes stretchable in a longitudinal direction, the method including: forming a plurality of through holes penetrating in a thickness direction in a first base block made of a conductive material; filling an insulating material into the plurality of through holes, respectively; forming a first probe accommodating hole for accommodating the plurality of probes in an insulating material in the plurality of through holes; and inserting the plurality of probes into the first probe accommodating hole. The insulating material may be removed so that an air layer is formed between an outer surface of some of the plurality of probes and an inner wall of the through hole, and the insulating material may be interposed between an outer surface of the rest of the plurality of probes and the inner wall of the through hole.

Some of the probes may include a signal probe for applying a test signal.

The rest of the probes may include a power probe for applying power.

The method may further include: forming first and second recessed parts having a predetermined depth to be filled with the insulating material around the through hole on one surface of the first base block.

In another general aspect, there is provided a method of fabricating a test socket that supports a plurality of probes stretchable in a longitudinal direction, the method including: forming a plurality of through holes penetrating in a thickness direction in first and second base blocks made of a conductive material; filling an insulating material into the plurality of through holes; forming first and second probe accommodating holes for accommodating the plurality of probes in an insulating material in the plurality of through holes; and inserting the plurality of probes into the first and second probe accommodating holes.

The insulating material maybe removed so that an air layer is formed between an outer surface of some of the plurality of probes and an inner wall of the through hole, and the insulating material maybe interposed between an outer surface of the rest of the plurality of probes and the inner wall of the through hole.

In another general aspect, there is provided a test socket including: a signal probe configured to apply a test signal; a power probe configured to apply power; and a socket block made of a conductive material configured to have a signal probe hole and a power probe hole that receive the signal probe and the power probe, respectively. An air layer may be included in at least some section between an outer circumferential surface of the signal probe and an inner wall of the signal probe hole, and an insulating material may be interposed between an outer circumferential surface of the power probe and an inner wall of the power probe hole.

Advantageous Effects

In the method of manufacturing a test socket according to an embodiment of the present invention, after forming a through hole in a base member made of a conductive material, an insulating material is filled therein, and a probe accommodating hole for accommodating the probe and a probe support hole for supporting the probe in the insulating material are formed by drilling. At this time, since the probe accommodating hole and the probe supporting hole are formed in a single process, the signal probe can be accurately positioned along the central axis of the probe receiving hole. As a result, insertion loss, return loss, and crosstalk (Crosstalk), isolation, Z-impedance, and inductance characteristics can be improved.

DESCRIPTION OF DRAWINGS

FIG. 1 is a cross-sectional view illustrating a test socket according to a first embodiment of the disclosure.

FIG. 2 is a cross-sectional view illustrating a socket block of FIG. 1.

FIGS. 3 to 6 are diagrams illustrating a method of fabricating a test socket of FIG. 1.

FIG. 7 is a cross-sectional view illustrating a gap plate of FIG. 2.

FIGS. 8 to 10 are diagrams illustrating a method of fabricating a first coupling block according to the first embodiment of the disclosure.

FIGS. 11 to 13 are diagrams illustrating a method of fabricating a second coupling block according to the first embodiment of the disclosure.

FIGS. 14 to 17 are diagrams illustrating a method of fabricating a test socket according to a second embodiment of the disclosure.

FIG. 18 is a cross-sectional view illustrating a socket block according to a third embodiment of the disclosure.

FIG. 19 is a cross-sectional view illustrating a socket block according to a fourth embodiment of the disclosure.

FIG. 20 is a cross-sectional view illustrating a socket block according to a fifth embodiment of the disclosure.

FIG. 21 is a cross-sectional view illustrating a socket block according to a sixth embodiment of the disclosure.

FIGS. 22 to 27 are diagrams illustrating a method of fabricating a socket block of FIG. 21.

FIGS. 28 to 31 each are graphs illustrating a comparison between insertion loss, return loss, isolation, and Z-impedance characteristics of the related art and the embodiment of the disclosure.

FIG. 32 is a diagram illustrating a test socket according to a seventh embodiment of the disclosure.

FIG. 33 is a cross-sectional view taken along line A-A of FIG. 32.

FIG. 34 is a diagram illustrating a socket block of FIG. 33.

FIG. 35 is a cross-sectional view taken along line B-B of FIG. 32.

FIG. 36 is a cross-sectional view taken along line C-C of FIG. 32.

FIG. 37 is a graph illustrating an insertion loss of a signal probe.

FIG. 38 is a graph illustrating a return loss of the signal probe.

FIG. 39 is a graph illustrating an impedance of the signal probe.

FIG. 40 is a graph illustrating a Z-impedance of a power probe.

FIGS. 41 to 44 are diagrams illustrating a method of fabricating a test socket of FIG. 32.

BEST MODE

Hereinafter, exemplary embodiments according to the disclosure will be described in detail with reference to the drawings.

FIG. 1 is a cross-sectional view illustrating a test socket 1 according to a first embodiment of the disclosure.

Referring to FIG. 1, the test socket 1 includes a socket block 2 and a plurality of probes, for example, as a power probe 5, a ground probe 6, a signal probe, or an RF probe 7 (hereinafter, referred to as 'signal probe'). The test socket 1 may include only any one or two of the power probe 5, the ground probe 6, and the signal probe 7.

The socket block 2 includes a first coupling block 3 and a second coupling block 4.

The first coupling block 3 includes a first insulating member 32 to one surface of the first base member 31 that are integrally formed.

The first base member 31 may be made of a conductive material, for example, brass or the like. The first base member 31 may be formed by coating the member made of an insulating material with a conductive material.

The first probe support member 32 may be integrally formed in a first power probe hole 21-1 and a first signal probe hole 23-1 that each accommodate the power probe 5 and the signal probe 7 in the first base member. The first probe support member 32 may support one end portions of the power probe 5 and the signal probe 7. The first insulating member 32 may be made of an insulating material, for example, engineering plastic or the like.

The second coupling block 4 may be formed by integrally joining the second base member 41 and the second probe support member 42 that are formed integrally. In this case, the joining may be implemented by insert-injecting an injection material into the second base member 42.

The second base member 41 maybe made of a conductive material, for example, brass or the like. The second base member 41 may be formed by coating the member made of an insulating material with a conductive material. The second base member 41 may have a thickness smaller than that of the first base member 31.

The second probe support member 42 supports the other end portions of the power probe 5 and the signal probe 7. The second probe support member 42 may be made of an insulating material, for example, engineering plastic or the like.

The second probe support member 42 includes a first support part 421 inserted into the second power probe hole 21-2, a second support part 422 inserted into a recessed part, and a cover plate 423 covering a surface of the second base member 41.

The power probe 5 is accommodated in a non-contact state with the first and second base members 31 and 41, and one end portion thereof is supported by the first probe support member 32 and the other end portion thereof is supported by the second probe support member 42. The power probe 5 includes a barrel 51, a first plunger 52, a second plunger 53, and a spring (not illustrated). The first plunger 52 and the second plunger 53 can be stretched along a longitudinal direction with a spring interposed therebetween, and may partially protrude from upper and lower surfaces of the socket block 2 to electrically connect between a power contact of a test object and a power contact of a test circuit.

The ground probe 6 is supported in a contact state with the first and second base members 31 and 41 and is supported so that both end portions thereof pass through the first and second probe support members 32 and 42. The ground probe 6 includes a barrel 61, a first plunger 62, a second plunger 63, and a spring (not illustrated). The first plunger 62 and the second plunger 63 can be stretched along a longitudinal direction with a spring interposed therebetween, and may partially protrude from the upper and lower surfaces of the socket block 2 to electrically connect between the ground contact of the test object and the ground contact of the test circuit.

The signal probe 7 is accommodated in a non-contact state with the first and second base members 31 and 41, and one end portion thereof is supported by the first probe support member 32 and the other end portion thereof is supported by the second probe support member 42. The signal probe 7 includes a barrel 71, a first plunger 72, a second plunger 73, and a spring (not illustrated). The first plunger 72 and the second plunger 73 can be stretched along a longitudinal direction with a spring interposed therebetween, and may partially protrude from upper and lower surfaces of the socket block 2 to electrically connect between a signal contact of a test object and a signal contact of the test circuit.

A gap plate 8 for aligning the positions of the plurality of probes 5, 6, and 7 is provided between the first coupling block 3 and the second coupling block 4.

As illustrated in FIG. 7, the gap plate 8 is provided with a power hole 81, a ground hole 82, and a signal hole 83 corresponding to outer diameters of the barrels 51, 61, and 71 of the power probe 7, the ground probe 6, and the signal probe 7.

The gap plate 8 may be made of an insulating material, for example, engineering plastic. The gap plate 8 may correct an alignment error when the first coupling block 3 and the second coupling block 4 are joined.

The power probe 5, the ground probe 6, and the signal probe 7 are not limited to a pogo type described above, but any probe that can be stretched may be applied.

FIG. 2 is a cross-sectional view illustrating the socket block 2 of FIG. 1.

Referring to FIG. 2, the socket block 2 includes the first and second coupling blocks 3 and 4. The socket block 2 includes a power probe hole 21 for accommodating the power probe 5 in a non-contact state, a ground probe hole 22 for accommodating the ground probe 6 in a contact state, and a signal probe hole 23 for accommodating the signal probe 7 in a non-contact state.

The first coupling block 3 includes the first base member 31 and the first probe support member 32 that are joined to each other. The second coupling block 4 includes the second base member 41 and the second probe support member 42 that are joined to each other.

The power probe hole 21 includes the first and second power probe holes 21-1 and 21-2 formed in the first and second coupling blocks 3 and 4, respectively.

The first power probe hole 21-1 includes a first power probe accommodating hole 211 formed in the first base member 31 to accommodate a part of the power probe 5 in a non-contact state, and a first power probe support hole 212 formed in the first probe support member 32 to support one end portion of the power probe 5.

The second power probe hole 21-2 includes a second power probe accommodating hole 213 formed in the second base member 41 to accommodate the rest of the power probe 5 in a non-contact state, and a second power probe support hole 214 formed in the second probe support member 42 to support the other end portion of the power probe 5.

The first and second power probe accommodating holes 211 and 213 maybe formed to vertically penetrate through the first and second base members 31 and 41 constantly with a diameter greater than the outer diameter of the barrel 51 of the power probe 5.

The first power probe support hole 212 includes a first barrel support groove 2121 formed in the first probe support member 32 in a shape corresponding to one end portion of the barrel 51 of the power probe 5, and a first plunger through hole 2122 communicating with the first barrel support groove 2121 and formed in the first probe support member 32 so that the first plunger 52 passes therethrough.

The second power probe support hole 214 includes a second barrel support groove 2141 formed in the second probe support member 32 in a shape corresponding to the other end portion of the barrel 51 of the power probe 5, and a second plunger through hole 2142 communicating with the second barrel support groove 2142 and formed in the second probe support member 42 so that the second plunger 53 passes therethrough.

The ground probe hole 22 includes the first and second power probe holes 22-1 and 22-2 formed in the first and second coupling blocks 3 and 4, respectively.

The first ground probe hole 22-1 includes a first ground probe accommodating hole 221 formed in the first base member 31 to accommodate a part of the ground probe 6 in a contact state, and a first ground probe through hole 222 formed in the first probe support member 32 so that the first plunger 62 of the ground probe 6 passes therethrough.

The second ground probe hole 22-2 includes a second ground probe accommodating hole 223 formed in the second base member 41 to accommodate the rest of the ground probe 6 in a contact state, and a second ground probe through hole 224 formed in the second probe support member 42 so that the second plunger 63 of the ground probe 6 passes therethrough.

The first and second ground probe accommodating holes 221 and 223 include first and second barrel accommodating holes 2211 and 2231 formed in the first and second base members 31 and 41, respectively, to constantly extend to the same diameter as the outer diameter of the barrel 61 of the ground probe 6, and first and second barrel end accommodating grooves 2212 and 2232 formed in the first and second base members 31 and 41, respectively, to accommodate both end portions of the barrel 61 of the ground probe 6.

The signal probe hole 23 includes first and second signal probe holes 23-1 and 23-2 formed in the first and second coupling blocks 3 and 4, respectively.

The first signal probe hole 23-1 includes a first signal probe accommodating hole 231 formed in the first base member 31 to accommodate a part of the signal probe 7 in a non-contact state, and a first signal probe support hole 232 formed in the first probe support member 32 to support one end portion of the signal probe 7.

The second signal probe hole 23-2 includes a second power probe accommodating hole 233 formed in the second base member 41 to accommodate the rest of the power probe 5 in a non-contact state, and a second power probe support hole 234 formed in the second probe support member 42 to support the other end portion of the power probe 7.

The first and second signal probe accommodating holes 231 and 233 maybe formed to vertically penetrate through the first and second base members 31 and 41 constantly with a diameter greater than the outer diameter of the barrel 71 of the signal probe 7.

The first signal probe support hole 232 includes a first barrel support groove 2321 formed in the first probe support member 32 in a shape corresponding to one end portion of the barrel 71 of the signal probe 7, and a first plunger through hole 2322 communicating with the first barrel support groove 2321 and formed in the first probe support member 32 so that the first plunger 72 passes therethrough.

The second signal probe support hole 234 includes a second barrel support groove 2341 formed in the second probe support member 42 in a shape corresponding to the other end portion of the barrel 71 of the signal probe 7, and a second plunger through hole 2341 communicating with the second barrel support groove 2342 and formed in the second probe support member 42 so that the second plunger 73 passes therethrough.

FIGS. 3 to 6 are diagrams illustrating a method of fabricating a test socket 1 of FIG. 1.

As illustrated in FIG. 3, the first base member 31 may be provided with the first power probe hole 21-1, the first ground probe hole 22-1, and the first signal probe hole 23-1, which extend parallel between the upper and lower surfaces, by, for example, a drill 100. Similarly, the second base member 41 may be provided with the second power probe hole 21-2, the second ground probe hole 22-2, and the second signal probe hole 23-2, which extend parallel between the upper and lower surfaces thereof, by, for example, the drill 100. The first and second base members 31 and 41 may be made of a conductive material, for example, brass.

The second base member 41 may be provided with recessed parts 21-3 and 23-3 while surrounding the second power probe hole 21-2 and the second signal probe hole 23-2 from the lower surface thereof.

As illustrated in FIG. 4, for example, by an insert injection mold using an injection material, the first probe support member 32 may be formed at a predetermined depth from one surface of the first power probe hole 21-1 and the first signal probe hole 23-1 of the first base member 31. Similarly, for example, by the insert injection mold using the injection material, the second probe support member 42 may be formed at a predetermined depth from one surface of the first power probe hole 21-2 and the first signal probe hole 23-2 of the second base member 41. The first and second base members 32 and 42 may be made of an insulating material, for example, engineering plastic.

As illustrated in FIG. 5, the first probe support member 32 may be provided with the first power probe support hole 212 and the first signal probe support hole 232 for supporting one end portions of the power probe 5 and the signal probe 7, respectively. Similarly, the second power probe support hole 214 may be provided with the second power probe support hole 214 and the second signal probe support hole 234 for supporting the other end portions of the power probe 5 and the signal probe 7.

As illustrated in FIG. 6, the power probe 5, the ground probe 6, and the signal probe 7 may be inserted into the first and second power probe holes 21-1 and 21-2, the first and second ground probe holes 22-1 and 22-2, and the first and second signal probe holes 23-1 and 23-2, respectively, and then, the first coupling block 3 and the second coupling block 4 may be joined by, for example, a bolt or a screw (not illustrated).

As described above, the first and second power probe support holes 212 and 214 and the first and second signal probe support holes 232 and 234 may be formed in a single process through the first and second power probe holes 21-1 and 21-2 and the first and second signal probe holes 23-1 and 23-2 in the first and second coupling blocks 3 and 4, respectively, so even if a large number of power probe holes 21 and/or signal probe holes 23 are formed in the test socket 1, errors due to alignment maybe reduced. Therefore, the power probe 5 and the signal probe 7 maybe supported to fit the central axis of the power probe hole 21 and the signal probe hole 23, and as a result, the insertion loss, return loss, crosstalk, isolation, Z-impedance, and inductance characteristics may be improved.

FIG. 7 is a cross-sectional view illustrating the gap plate 8 of FIG. 2.

As illustrated in FIG. 7, the gap plate 8 made of an insulating material may be formed with the power hole 81, the ground hole 82, and the signal hole 83 corresponding to each outer diameter of the barrel 51 of the power probe 5, the barrel 61 of the ground probe 6, and the barrel 71 of the signal probe 7 by, for example, the drill 100. As described above, the gap plate 8 thus formed may be interposed between the first coupling block 3 and the second coupling block 4 as illustrated in FIG. 2.

Hereinafter, a method of fabricating first and second coupling blocks 3 and 4 will be described in detail.

FIGS. 8 to 10 are diagrams illustrating a method of fabricating a first coupling block 3 according to the first embodiment of the disclosure.

As illustrated in FIG. 8, the first base member 31 made of, for example, brass may be provided with the first power probe hole 21-1, the first ground probe hole 22-1, and the first signal probe hole 23-1 by the drilling.

As illustrated in FIG. 9, the mold member 34 may be inserted into the first power probe hole 21-1, the first ground probe hole 22-1, and the first signal probe hole 23-1 from the lower surface of the first base member 31, for example. In this case, the first power probe hole 21-1 and the first signal probe hole 23-1 are emptied to a predetermined depth so that the first probe support member 32 is filled, and the whole of the first ground probe hole 22-1 may be closed with the mold member 34. Thereafter, for example, a resin of an insulating material is filled into the empty part, and the first probe support member 32 may be formed in the first base member 31 by applying, for example, a pressure of 160 kf/cm2 at 430° C. for 3.5 seconds.

As illustrated in FIG. 10, the first power probe support hole 212 and the first signal probe support hole 232 maybe drilled in the first probe support member 32.

FIGS. 11 to 13 are diagrams illustrating a method of fabricating a second coupling block 4 according to the first embodiment of the disclosure.

As illustrated in FIG. 11, the second base member 41 made of, for example, brass may be provided with the second power probe hole 21-2, the second ground probe hole 22-2, and the second signal probe hole 23-2 by the drilling. In addition, the lower surface of the second base member 41 may be provided with the recessed parts 21-3 and 23-3 while surrounding the second power probe hole 21-2 and the second signal probe hole 23-2. The recessed parts 21-3 and 23-3 may have a shape in which a cross-sectional area gradually widens from the lower surface of the second base member 41.

As illustrated in FIG. 12, the second power probe hole 21-2, the second ground probe hole 22-2, and the second signal probe hole 23-2 may be filled with the mold member 34 from the upper surface of the second base member 41. In this case, the second power probe hole 21-2 and the second signal probe hole 23-2 of the second base member 41 are emptied to a predetermined depth so that the second probe support member 42 is filled, and the whole of the second ground probe hole 22-2 may be closed with the mold member 34. In addition, it is possible to cover the mold cover 35 spaced apart from the lower surface of the second base member 41 at a predetermined interval. Thereafter, for example, a resin of an insulating material is filled into the empty part and the space within the mold cover 35, and the first base member 31 may be provided with the second probe support member 42 by applying, for example, a pressure of 160 kf/cm2 at 430° C. for 3.5 seconds.

As illustrated in FIG. 13, a second power probe support hole 214, a ground probe through hole 224, and a second signal probe support hole 234 maybe formed in the second probe support member 42 by the drilling.

FIGS. 14 to 17 are diagrams illustrating a method of fabricating a test socket 1 according to a second embodiment of the disclosure.

As illustrated in FIG. 14, a first recessed part 317 may be formed at a predetermined depth in a portion where one ends of the power probe 5 and the signal probe 7 are located. Similarly, a second recessed part 318 maybe formed at a predetermined depth in the portion where the other ends of the power probe 5 and the signal probe 7 are located by, for example, the drill 100. Here, the first and second recessed parts 317 and 318 may have a shape gradually widening toward the floor.

As illustrated in FIG. 15, the first and second recessed parts 317 and 318 are filled with an insulating material such as engineering plastic by the insert injection mold to form the first and second probe supporting members 32 and 42.

As illustrated in FIG. 16, the first and second power probe holes 21-1 and 21-2, the first and second ground probe holes 22-1 and 22-2, and the first and second signal probe holes 23-1 and 23-2 are formed in the first and second base members 31 and 41 and the first and second probe support members 32 and 42, respectively.

As illustrated in FIG. 17, the power probe 5, the ground probe 6, and the signal probe 7 may be inserted into the power probe hole 21, the ground probe hole 22, and the signal probe hole 23, respectively. Thereafter, by joining the first coupling block 3 and the second coupling block 4, the socket block 2 may be formed. The gap plate 8 may be interposed between the first coupling block 3 and the second coupling block 4.

FIG. 18 is a cross-sectional view illustrating a socket block 2 according to a third embodiment of the disclosure.

Referring to FIG. 18, the socket block 2 includes the first coupling block 3 and the second coupling block 4 that are joined to each other.

The first coupling block 3 may be formed by integrally joining the first base member 31 made of a conductive material and the first probe support member 32 made of an insulating material. The first probe support member 32 may be inserted to a predetermined depth inside the first power probe hole 21-1 and the first signal probe hole 23-1 on one surface of the first base member 31 by, for example, the insert injection mold.

The first probe support member 32 may support one end portions of the power probe 5 and the signal probe 7 so as to partially protrude to the outside.

*110The second coupling block 4 may be formed by integrally joining the second base member 41 made of a conductive material and the second probe support member 42 made of an insulating material. The second probe support member 42 may be inserted to a predetermined depth inside the second power probe hole 21-2 and the second signal probe hole 23-2 on one surface of the second base member 41 by, for example, the insert injection mold.

The second probe support member 42 may support the other end portions of the power probe 5 and the signal probe 7 so as to partially protrude to the outside.

The gap plate 8 for aligning the positions of the power probe 5, the ground probe 6, and the signal probe 7 may be included between the first coupling block 3 and the second coupling block 4.

FIG. 19 is a cross-sectional view illustrating a socket block 2 according to a fourth embodiment of the disclosure.

Referring to FIG. 19, the socket block 2 includes the first coupling block 3 and the second coupling block 4 that are joined to each other.

The first coupling block 3 may be formed by integrally joining the first base member 31 and the first probe support member 32. Here, the joining may be implemented by, for example, an adhesive sheet, the insert injection mold and the like.

Similarly, the second coupling block 4 may be formed by integrally joining the second base member 41 and the second probe support member 42. Here, the joining may be implemented by an adhesive sheet, the insert injection mold, and the like.

The first and second base members 31 and 41 may accommodate the power probe 5 and the signal probe 7 in a non-contact state, and accommodate the ground probe 6 in a contact state.

The first and second base members 31 and 41 may be made of a conductive material, for example, brass, and the like. The second base member 41 may have a thickness smaller than that of the first base member 31.

The first and second probe support members 32 and 42 may support both end portions of the power probe 5, the ground probe 6, and the signal probe 7 so that they partially protrude from the upper and lower surfaces of the socket block 2.

The first and second probe support members 32 and 42 may be made of an insulating material, for example, engineering plastic or the like.

The first and second probe support members 32 and 42 include first support parts 321 and 421 inserted into both end portions of the power probe hole 21, second support parts 322 and 422 extending radially from the first support parts 321 and 421, and cover plates 323 and 423 covering the surfaces of the first and second base members 31 and 41. Since a cross-sectional area of the second support parts 322 and 422 gradually decreases toward the cover plates 323 and 423, the cover plates 323 and 423 may be firmly joined to the first and second base members 31 and 41.

The gap plate 8 for aligning the positions of the power probe 5, the ground probe 6, and the signal probe 7 may be included between the first coupling block 3 and the second coupling block 4.

FIG. 20 is a cross-sectional view illustrating a socket block 2 according to a fifth embodiment of the disclosure.

Referring to FIG. 20, the socket block 2 includes the coupling block 3 and a cover member 9.

The coupling block 3 may be formed by integrally joining the base member 31 made of a conductive material such as brass and the probe support member 32 made of an insulating material such as engineering plastic. The probe support member 32 may be formed to a predetermined depth inside the power probe hole 21 and the signal probe hole 23 on one surface of the base member 31 by, for example, the insert injection mold.

The probe support member 32 may support one end portions of the power probe 5 and the signal probe 7 so as to partially protrude to the outside.

The cover member 9 may be joined to the other surface of the base member 31 using screws, bolts, or the like. The cover member 9 may be made of, for example, engineering plastic.

The cover member 9 may support the other end portions of the power probe 5 and the signal probe 7 so as to partially protrude to the outside.

The gap plate 8 for aligning the positions of the power probe 5, the ground probe 6, and the signal probe 7 may also be included between the coupling block 3 and the cover member 9.

FIG. 21 is a cross-sectional view illustrating a socket block 2 according to a sixth embodiment of the disclosure.

Referring to FIG. 21, the socket block 2 includes a base block 2-1, a first coupling block 2-2, and a second coupling block 2-3.

The base block 2-1 may be made of a conductive material, for example brass. The base block 2-1 may include the power probe accommodating hole 211, the ground probe accommodating hole 221, and the signal probe accommodating hole 231 that accommodate the power probe 5, the ground probe 6, and the signal probe 7, respectively.

The first coupling block 2-2 includes the first base member 31 and the first probe support member 32 that are integrally formed. The first coupling block 2-2 may support one end portions of the power probe 5 and the signal probe 7 so as to partially protrude to the outside.

The first base member 31 may be made of a conductive material, for example, brass. The first base member 31 may be provided with a first probe support hole 311 to which the first probe support member 32 is integrally inserted and joined, and a first plunger through hole 312 through which the first plunger 62 of the ground probe 6 passes.

The first probe support member 32 may be made of an insulating material, for example, engineering plastic or the like. The first probe support member 32 may be provided with the first power probe support hole 212 and the first signal probe support hole 232.

The second coupling block 2-3 includes the second base member 41 and the second probe support member 42 that are integrally formed. The second coupling block 2-3 may support the other end portions of the power probe 5 and the signal probe 7 so as to partially protrude to the outside.

The second base member 41 maybe made of a conductive material, for example, brass. The second base member 41 may be provided with a second probe support hole 313 to which the second probe support member 42 is integrally inserted and joined, and a second plunger through hole 314 through which the second plunger 63 of the ground probe 6 passes.

The second probe support member 42 may be made of an insulating material, for example, engineering plastic. The second probe support member 42 may be provided with the second power probe support hole 213 and the second signal probe support hole 233.

FIGS. 22 to 27 are diagrams illustrating a method of fabricating a socket block of FIG. 21.

As illustrated in FIG. 22, the power probe accommodating hole 211, the ground probe accommodating hole 221, and the signal probe accommodating hole 231 penetrating through the upper and lower surfaces of the base block 2-1 made of a conductive material may be formed by for example, drilling.

As illustrated in FIG. 23, the first probe support hole 311 and the first plunger through hole 312 penetrating through the upper and lower surfaces of the first base member 31 made of a conductive material may be formed by for example, drilling. Similarly, the second probe support hole 313 and the second plunger passing hole 314 penetrating through the upper and lower surfaces of the second base member 41 made of a conductive material may be formed by for example, drilling.

As illustrated in FIG. 24, the first probe support member 32 may be formed by inserting an insulating material into the first probe support hole 311 by the insert injection. Similarly, the second probe support member 42 may be formed by inserting an insulating material into the second probe support hole 313 by the insert injection.

As illustrated in FIG. 25, the first power probe support hole 212 and the first signal probe support hole 232 may be formed in the first probe support member 32 by for example, drilling. In this case, the drilling of the first power probe support hole 212 and the first signal probe support hole 232 may be performed through the power probe accommodating hole 211, and the signal probe accommodating hole 231 while the base block 2-1 and the first base member 31 are firmly joined by a bolt 111.

As illustrated in FIG. 26, the second power probe support hole 213 and the second signal probe support hole 233 may be drilled in the second probe support member 42. In this case, the drilling of the second power probe support hole 213 and the second signal probe support hole 233 may be performed through the power probe accommodating hole 211, and the signal probe accommodating hole 231 while the base block 2-1 and the second base member 41 are firmly joined by, for example, the bolt 111.

As illustrated in FIG. 27, after inserting the power probe 5, the ground probe 6, and the signal probe 7 into the power probe accommodating hole 211, the ground probe accommodating hole 221, and the signal probe accommodating hole 231, respectively, the first coupling block 2-2 and the second coupling block 2-3 maybe joined on the upper and lower surfaces of the base block 2-1 by using the bolt 111.

FIGS. 28 to 31 are graphs showing a comparison of insertion loss characteristics, return loss characteristics, isolation characteristics, and Z-impedance characteristics of the test socket 1 according to the related art and the embodiment of the disclosure.

It is preferable that the insertion loss is ideally zero. Referring to FIG. 28, it can be seen that, based on the allowable insertion loss (−1.0 dB), the related art exceeds the standard at about 22.0 GHz, while the disclosure shows a very good insertion loss characteristics at about 45.2 GHz.

It is preferable that the return loss is as small as possible. Referring to FIG. 29, it can be seen that, based on the allowable return loss (−10 dB), the related art exceeds the reference at about 17.1 GHz, while the disclosure shows a very good return loss characteristics at about 46.5 GHz.

It is preferable that the isolation characteristics are as small as possible. Referring to FIG. 30, it can be seen that based on the allowable isolation characteristics (−40 dB), the prior art exceeds the allowable isolation characteristic (−40 dB) at about 24.4 GHz, while the disclosure is about 27.0 GHz, which is somewhat superior and shows little change.

It is preferable that the Z-Impedance is as small as possible. Referring to FIG. 31, it can be seen that, based on an allowable Z-impedance (1 GHz), the prior art represents about 0.9 Ω, while the disclosure is about 0.65 Ω, which is more excellent.

Figure 33:
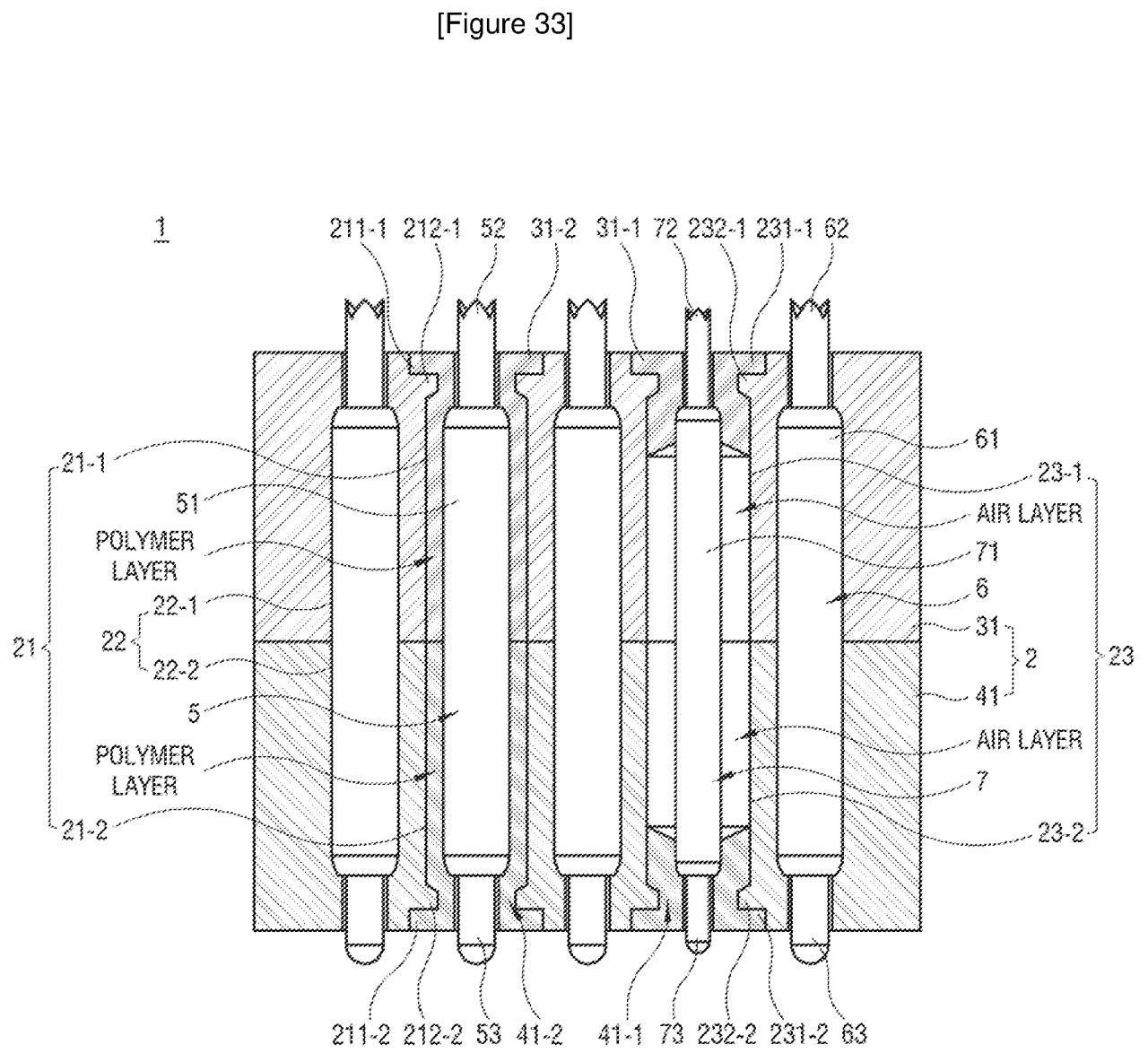
Figure 34:
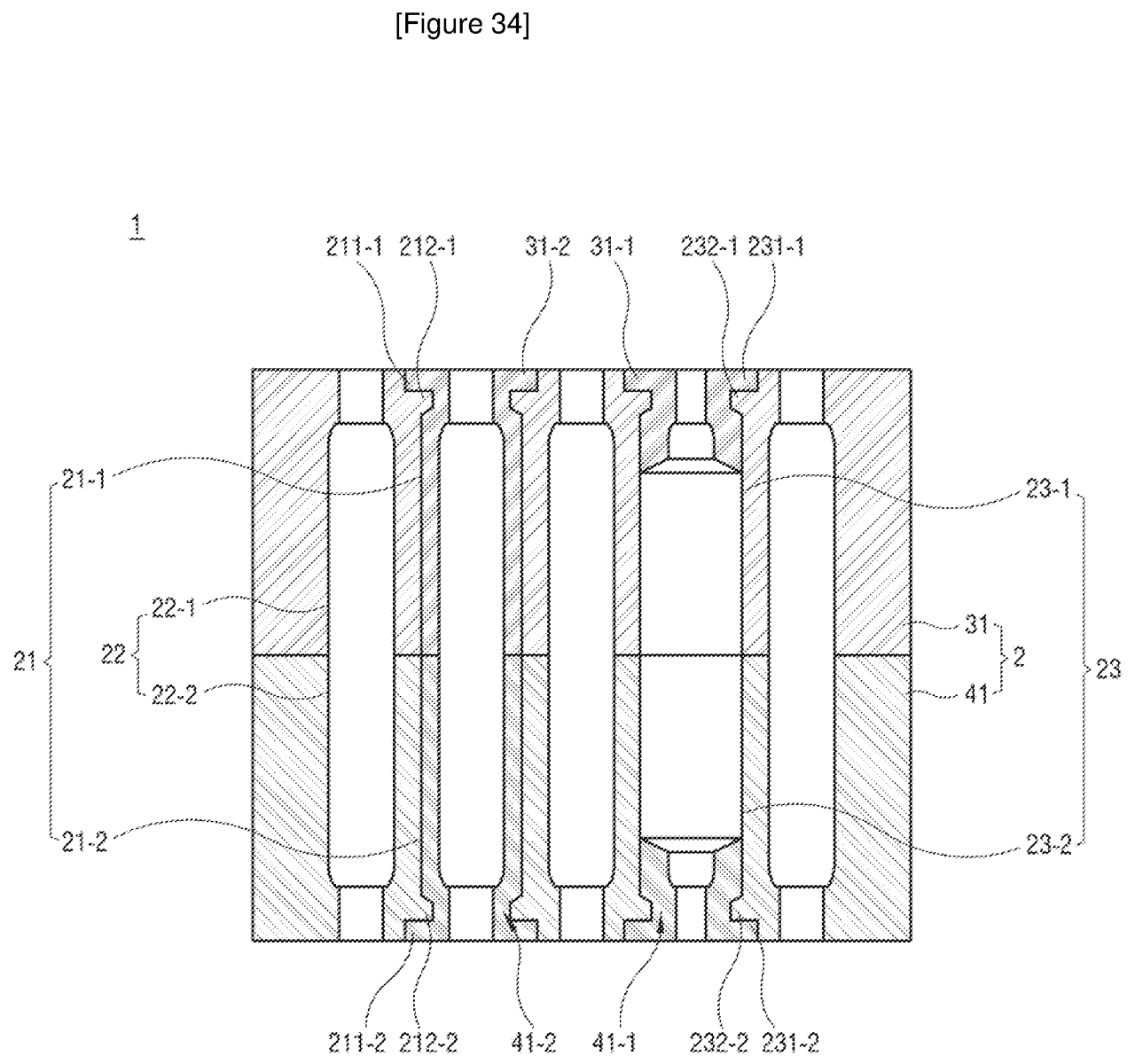

FIG. 32 is a diagram illustrating a test socket 1 according to a seventh embodiment of the disclosure, FIG. 33 is a diagram illustrating a cross section taken along line A-A of FIG. 32, FIG. 34 is a diagram illustrating the socket block 2 of FIG. 33, FIG. 35 is a diagram illustrating a cross-section taken along line B-B of FIG. 32, and FIG. 36 is a diagram illustrating a cross-section taken along line C-C of FIG. 32.

Referring to FIG. 32, the test socket 1 includes the socket block 2 made of a conductive material and the power probe 5, the ground probe 6, and the signal probe 7 supported on the socket block 2.

Referring to FIGS. 33 and 34, the socket block 2 includes the first base block 31 and the second base block 41.

The socket block 2 may be provided with the power probe hole 21, the ground probe hole 22, and the signal probe hole 23.

The power probe hole 21 includes the first and second power probe holes 21-1 and 21-2 formed in the first base block 31 and the second base block 41, respectively.

The ground probe hole 22 includes the first and second power probe holes 22-1 and 22-2 formed in the first base block 31 and the second base block 41, respectively.

The signal probe hole 23 includes the first and second power probe holes 23-1 and 23-2 formed in the first base block 31 and the second base block 41, respectively.

The socket block 2 includes first and second recessed parts 211-1 and 211-2 around a location where the power probe (5 in FIG. 33) protrudes on the upper and lower surfaces thereof and third and fourth recessed parts 231-1 and 231-2 where the signal probe 7 protrudes.

The first and second recessed parts 211-1 and 211-2 may have a horizontal cross-sectional area larger than that of the first and second power probe holes 21-1 and 21-2. A first locking jaw 212-1 may be formed between the first recessed part 211-1 and the first power probe hole 21-1, and thus, the first power probe support part 31-2 may be firmly supported to the first power probe hole 21-1 of the first base block 31. In addition, a second locking jaw 212-2 may be formed between the second recessed part 211-2 and the second power probe hole 21-1, and thus, the second power probe support part 41-2 may be firmly supported to the second power probe hole 21-2 of the first base block 41.

Similarly, the third and fourth recessed parts 231-1 and 231-2 may have a horizontal cross-sectional area larger than that of the first and second signal probe holes 23-1 and 23-2. A third locking jaw 232-1 may be formed between the third recessed part 231-1 and the first signal probe hole 23-1, and thus, the first signal probe support part 31-1 may be firmly supported to first signal probe hole 23-1 of the first base block 31. In addition, a fourth locking jaw 232-2 may be formed between the fourth recessed part 231-2 and the second signal probe hole 23-2, and thus, the second signal probe support part 41-1 maybe firmly supported to second signal probe hole 23-2 of the first base block 41.

The socket block 2 includes the first and second signal probe support parts 31-1 and 41-1 and the first and second power probe support parts 31-2 and 41-2 that are formed on the first base block 31 and the second base block 41.

As illustrated in FIG. 32, the first power probe support part 31-2 may be formed to be integrated into one around two or more power probes 5 arranged adjacently. As a result, the first power probe support part 31-2 may prevent a short circuit by preventing a power terminal provided on the test object from contacting the conductive socket block 2 during the test. Similarly, the first signal probe support part 31-1 may be formed to be integrated into one around two or more adjacent signal probes 7. As a result, the first signal probe support part 31-1 may prevent a short circuit by preventing a signal terminal provided on the test object from contacting the conductive socket block 2 during the test.

As illustrated in FIGS. 33 and 35, the first and second signal probe support parts 31-1 and 41-1 are formed at the top and bottom in the first and second signal probe holes 23-1 and 23-2 formed in the first base block 31 and the second base block 41, respectively. In this way, an air layer may be provided between an outer surface of the signal probe 7 and an inner wall surface of the signal probe hole 23 of the socket block 2.

As illustrated in FIGS. 33 and 36, the first and second power probe support parts 31-2 and 41-2 may be formed in the first and second power probe holes 21-1 and 23-2 formed in the first base block 31 and the second base block 41, respectively. In this way, an insulating material, for example, a polymer layer may be provided between an outer surface of the power probe 5 and an inner wall surface of the power probe hole 21 of the socket block 2.

FIG. 37 is a graph illustrating the insertion loss of the signal probe 7.

Referring to FIG. 37, the insertion loss when the air layer is disposed between the signal probe 7 and the inner wall surface of the signal probe hole 23 of the socket block 2 is −0.09 (dB) at 20 GHz, and the insertion loss when the polymer layer is disposed is −0.91 (dB) at 20 GHz. Since it is desirable to design the insertion loss close to 0 (dB), the air layer may be provided between the signal probe 7 and the inner wall surface of the signal probe hole 23 of the socket block 2.

FIG. 38 is a graph illustrating the return loss of the signal probe 7.

Referring to FIG. 38, the return loss when the air layer is disposed between the signal probe 7 and the inner wall surface of the signal probe hole 23 of the socket block 2 is −20 (dB) at 20 GHz, and the insertion loss when the polymer layer is disposed is −7.5 (dB) at 20 GHz. The smaller the return loss, the more preferable. Therefore, it is preferable that an air layer is provided between the signal probe 7 and the inner wall surface of the signal probe hole 23 of the socket block 2.

FIG. 39 is a graph illustrating the impedance of the signal probe 7.

Referring to FIG. 39, the minimum impedance during 200 ps when the air layer is disposed between the signal probe 7 and the inner wall surface of the signal probe hole 23 of the socket block 2 is 48.3 W, and the minimum impedance during 200 ps when the polymer layer is disposed is 40.1 W. Since it is preferable that the impedance is maintained constantly to 50 W, the air layer may be provided between the signal probe 7 and the inner wall surface of the signal probe hole 23 of the socket block 2.

As described above, the case where the air layer provided between the signal probe 7 and the inner wall surface of the signal probe hole 23 of the socket block 2 is superior in terms of the insertion loss, the return loss, and the impedance characteristics than the case where the polymer layer provided between the signal probe 7 and the inner wall surface of the signal probe hole 23 of the socket block 2.

Therefore, when fabricating the test socket, all of the polymer resin filled in the signal probe hole 23 of the socket block 2 maybe removed except for a portion supporting both ends of the signal probe 7.

FIG. 40 is a graph illustrating the Z-impedance of the power probe 5.

Referring to FIG. 40, the Z-impedance when the air layer is disposed between the power probe 5 and the inner wall surface of the power probe hole 21 of the socket block 2 is 0.71 W at 1 GHz, and the minimum impedance during 1 ps when the polymer layer is disposed is 0.64 Wat 1 GHz. The smaller the Z-impedance, the more preferable. Therefore, it is preferable that the polymer layer is provided between the power probe 5 and the inner wall surface of the power probe hole 21 of the socket block 2.

Therefore, in the fabricating of the test socket, the polymer resin filled in the power probe hole 21 of the socket block 2 may remove only the portion corresponding to the outer surface of the power probe 5, that is, only the space to accommodate the power probe 5, and thus the power probe 5 may contacts the polymer layer.

FIGS. 41 to 44 are diagrams illustrating a method of fabricating a test socket 1 of FIG. 32.

In FIG. 41, the first base block 31 and the second base block 41 made of a conductive material, for example, brass may be provided.

In FIG. 42, the first and second ground probe holes 22-1 and 22-2 corresponding to the outer shape of the ground probe 6, the first and second through holes 210-1 and 210-2 having an inner diameter larger than the outer diameter of the power probe 5, and the third and fourth through holes 230-1 and 230-2 having the inner diameter larger than the outer diameter of the signal probe 7 may be formed, for example, by the drilling in the first base block 31 and the second base block 41, respectively.

The first to fourth through holes 210-1, 210-2, 230-1, and 230-2 may be provided with the first to fourth recessed parts 211-1, 211-2, 231-1 and 231-2 on the upper surface of the first base block 31 and the lower surface of the second base block 41, respectively. In addition, bottleneck portions 212-1, 212-2, 232-1, and 232-2 having a smaller inner diameter than the first to fourth through holes 210-1, 210-2, 230-1 and 230-2 may be provided between the first through hole 210-1 and the first recessed part 211-1, between the second through hole 210-2 and the second recessed part 211-2, between the third through hole 230-1 and the third recessed part 231-1, and between the fourth through hole 230-2 and the fourth recessed part 231-2.

In FIG. 43, an insulating material, for example, a polymer layer may be filled in the first to fourth through holes 210-1, 210-2, 230-1, and 230-2 of FIG. 42. The insulating material (polymer) layer may be formed by injecting a liquid epoxy resin, for example, as an injection material or by insert-injecting.

In FIG. 44, the polymer layer in the first and second through holes 210-1 and 210-2 may be formed, for example, by the drilling into a shape corresponding to the outer shape of the power probe 5.

In addition, the polymer layer in the third and fourth through holes 230-1 and 230-2 may be entirely removed between the outer circumferential surface of the signal probe 7 (the outer circumferential surface of the barrel 71) and the inner surfaces of the third and fourth through holes 230-1 and 230-2.

Finally, the power probe 5, the ground probe 6, and the signal probe 7 may be inserted into the first and second power probe holes 21-1 and 21-2, the first and second ground probe holes 22-1 and 22-2 and the first and second signal probe holes 23-1 and 23-2 of the first and second base blocks 31 and 41, respectively, and then the first and second base blocks 31 and 41 are joined each other.

According to various embodiments of the disclosure, the process of FIGS. 42 and 43 maybe omitted and the shape illustrated in FIG. 44 may be formed directly by the insert injection.

According to the method of fabricating a test socket according to an embodiment of the disclosure, since the probe accommodating hole and the probe support hole are formed in a single process, the signal probe may be positioned on the central axis of the probe accommodating hole, and as a result, the insertion loss, return loss, crosstalk, isolation, Z-impedance, and inductance characteristics may be improved.

In the foregoing specification, the disclosure and its advantages have been described with reference to specific embodiments. However, it will be apparent to those of ordinary skill in the art that various modifications and changes can be made without departing from the scope of the disclosure as set forth in the claims below. Accordingly, the specification and drawings should be regarded as an example of the disclosure rather than a limitation. All these possible modifications should be made within the scope of the disclosure.

The invention claimed is:

1. A method of fabricating a test socket that supports a probe stretchable in a longitudinal direction, the method comprising:

forming, via a drill, a probe hole for accommodating the probe in a base member made of a conductive material;

filling the probe hole with an insulating material to a predetermined depth from an upper surface of the base member to form a probe support member;

forming, via the drill, a first support hole for supporting one end portion of the probe in the probe support member in the probe hole;

forming a second support hole for supporting another end portion of the probe in a cover member made of an insulating material;

inserting the probe into the probe hole in a non-contact state and supporting both end portions of the probe in the first support hole and the second support hole, respectively; and joining the cover member to a lower surface of the base member, wherein the forming the first support hole comprises forming, via the drill, the first support hole through the probe hole, and wherein the forming of the probe hole and the forming of the first support hole is completed in a single process.

2. The method of claim 1, wherein the filling of the insulating material includes:

disposing a mold cover to be spaced apart from one surface of the base member at a predetermined interval; and filling the predetermined interval and the probe hole with the insulating material.

3. The method of claim 1, further comprising:

forming a coupling groove surrounding the probe hole on one surface of the base member.

4. The method of claim 3, wherein the coupling groove has a cross-sectional area widening in a depth direction from the one surface.

5. The method of claim 1, further comprising:

interposing a gap plate between the base member and the cover member.

6. The method of claim 1, wherein the probe hole includes a protrusion protruding inwardly at a position where the probe support member is formed.

7. A method of fabricating a test socket that supports a probe stretchable in a longitudinal direction, the method comprising:

forming, by a drill, a first recessed part with a predetermined depth on one surface of a first base member made of a conductive material at a position where the probe is disposed;

forming, by the drill, a first probe support part by filling the first recessed part with an insulating material;

forming, in a single process and by the drill, a first probe accommodating hole for accommodating the probe in the first base member at a position corresponding to the first recessed part and a first support hole, through the probe hole, for supporting one end portion of the probe in the first probe support part;

forming a second support hole for supporting the other end portion of the probe in a cover member made of an insulating material;

inserting the probe into the first probe accommodating hole and supporting one end portion and the other end portion of the probe in the first support hole and the second support hole, respectively; and joining the cover member to another surface of the first base member.

8. The method of claim 7, further comprising:

forming a first recessed portion with a predetermined depth on one surface of a second base member made of a conductive material at a position where the probe is disposed;

forming a second probe support part by filling a second recessed part with an insulating material;

forming a second probe accommodating hole for accommodating the probe in the first base member at a position corresponding to the first recessed part and a second support hole for supporting another end portion of the probe in the second probe support part;

inserting the probe into the first probe accommodating hole and the second probe accommodating hole and supporting one end portion and the another end portion of the probe in the first support hole and the second support hole, respectively; and joining another surface of the second base member to another surface of the first base member.

9. A method of fabricating a test socket that supports a probe stretchable in a longitudinal direction, the method comprising:

forming a probe accommodating hole for accommodating the probe in a base block made of a conductive material;

forming first and second through holes in positions corresponding the probe accommodating hole in a first base member and a second base member of a conductive material, respectively;

forming first and second probe support portions by filling an insulating material in the first and second through holes;

forming first and second support holes for supporting both ends of the probe in the first and second probe support portions;

inserting the probe into the probe accommodating hole, supporting both ends of the probe in the first and second support holes; and joining the first and second base members to upper and lower surfaces of the base block, respectively.

10. A method of fabricating a test socket that supports a plurality of probes stretchable in a longitudinal direction, the method comprising:

forming a plurality of through holes penetrating in a thickness direction in a first base block made of a conductive material;

filling an insulating material into the plurality of through holes;

forming a first probe accommodating hole for accommodating the plurality of probes in an insulating material in the plurality of through holes; and inserting the plurality of probes into the first probe accommodating hole, wherein the insulating material is removed so that an air layer is provided between an outer surface of some of the plurality of probes and an inner wall of a through hole of the plurality of through holes, and the insulating material is interposed between an outer surface of a rest of the plurality of probes and the inner wall of the through hole of the plurality of through holes.

11. The method of claim 10, wherein some of the probes include a signal probe for applying a test signal.

12. The method of claim 10, wherein the rest of the probes include a power probe for applying power.

13. The method of claim 10, further comprising:

forming first and second recessed parts having a predetermined depth to be filled with the insulating material around the through hole of the plurality of through holes on one surface of the first base block.

14. A method of fabricating a test socket that supports a plurality of probes stretchable in a longitudinal direction, the method comprising:

forming a plurality of through holes penetrating in a thickness direction in first and second base blocks made of a conductive material;

filling an insulating material into the plurality of through holes;

forming first and second probe accommodating holes for accommodating the plurality of probes in an insulating material in the plurality of through holes; and inserting the plurality of probes into the first and second probe accommodating holes, wherein the insulating material is removed so that an air layer is formed between an outer surface of some of the plurality of probes and an inner wall of a through hole of the plurality of through holes, and the insulating material is interposed between an outer surface of the rest of the plurality of probes and the inner wall of the through hole of the plurality of through holes.

* * * * *